United States Patent
Brioschi et al.

(10) Patent No.: US 11,760,627 B2
(45) Date of Patent: Sep. 19, 2023

(54) MEMS STRESS REDUCTION STRUCTURE EMBEDDED INTO PACKAGE

(71) Applicant: InvenSense, Inc., San Jose, CA (US)

(72) Inventors: Roberto Brioschi, Austin, TX (US); Benyamin Gholami Bazehhour, Redwood City, CA (US); Milena Vujosevic, San Jose, CA (US); Kazunori Hayata, Cupertino, CA (US)

(73) Assignee: InvenSense, Inc., San Jose, CA (US)

( * ) Notice: Subject to any disclaimer, the term of this patent is extended or adjusted under 35 U.S.C. 154(b) by 187 days.

(21) Appl. No.: 17/343,919

(22) Filed: Jun. 10, 2021

(65) Prior Publication Data

US 2022/0396472 A1  Dec. 15, 2022

(51) Int. Cl.
  *B81B 7/00* (2006.01)
  *B81C 1/00* (2006.01)

(52) U.S. Cl.
  CPC ........ *B81B 7/0048* (2013.01); *B81C 1/00325* (2013.01); *B81B 2201/0235* (2013.01); *B81B 2201/0242* (2013.01); *B81B 2201/0257* (2013.01); *B81B 2201/0264* (2013.01); *B81B 2201/0271* (2013.01); *B81B 2201/042* (2013.01); *B81B 2207/012* (2013.01)

(58) Field of Classification Search
  CPC .......... B81B 7/0048; B81B 2201/0235; B81B 2201/0242; B81B 2201/0257; B81B 2201/0264; B81B 2201/0271; B81B 2201/042; B81B 2207/012; B81B 7/0054; B81C 1/00325; B81C 2203/0109
  See application file for complete search history.

(56) References Cited

U.S. PATENT DOCUMENTS

| | | | |
|---|---|---|---|
| 10,189,703 B2 | 1/2019 | Ghidoni | |
| 10,225,635 B2 | 3/2019 | Brioschi | |
| 10,252,906 B2 | 4/2019 | Brioschi | |
| 10,531,204 B2 | 1/2020 | Brioschi | |
| 10,597,287 B2 | 3/2020 | Ghidoni | |
| 11,032,629 B2 | 6/2021 | Brioschi | |
| 11,146,894 B2 | 10/2021 | Brioschi | |
| 2009/0230487 A1* | 9/2009 | Saitoh | B81C 1/00333 257/659 |
| 2009/0282915 A1* | 11/2009 | Ohta | H05K 13/00 73/504.12 |
| 2017/0146345 A1* | 5/2017 | Fischer | B60W 30/02 |
| 2017/0313579 A1* | 11/2017 | Ghidoni | B81B 7/02 |
| 2018/0127265 A1 | 5/2018 | Brioschi | |

(Continued)

OTHER PUBLICATIONS

Invitation to Pay Additional Fees received for PCT Patent Application No. PCT/US2022/025405, dated Jul. 27, 2022, 10 pages.

(Continued)

*Primary Examiner* — Yasser A Abdelaziez
(74) *Attorney, Agent, or Firm* — Van Hoven PC; Joshua Van Hoven

(57) ABSTRACT

A microelectromechanical system (MEMS) sensor package includes a laminate that provides physical support and electrical connection to a MEMS sensor. A resin layer is embedded within an opening of the laminate and a MEMS support layer is embedded within the opening by the resin layer. A MEMS structure of the MEMS sensor is located on the upper surface of the MEMS support layer.

29 Claims, 20 Drawing Sheets

(56) References Cited

U.S. PATENT DOCUMENTS

| | | |
|---|---|---|
| 2019/0127218 A1 | 5/2019 | Ghidoni |
| 2019/0141426 A1 | 5/2019 | Brioschi |
| 2019/0158962 A1 | 5/2019 | Achehboune |
| 2020/0045476 A1 | 2/2020 | Wang et al. |
| 2020/0095114 A1 | 3/2020 | Pomarico |
| 2020/0095116 A1 | 3/2020 | Cho et al. |
| 2020/0299127 A1 | 9/2020 | Brioschi |
| 2020/0304920 A1 | 9/2020 | Achehboune |
| 2020/0304921 A1 | 9/2020 | Brioschi |
| 2020/0304922 A1 | 9/2020 | Brioschi |
| 2020/0304923 A1 | 9/2020 | Brioschi |
| 2020/0369514 A1 | 11/2020 | Brioschi |
| 2020/0377363 A1 | 12/2020 | Achehboune |
| 2021/0144482 A1 | 5/2021 | Piechocinski |
| 2021/0204049 A1 | 7/2021 | Brioschi |

OTHER PUBLICATIONS

International Search Report and Written Opinion received for PCT Patent Application No. PCT/US2022/025405, dated Sep. 19, 2022, 19 pages.

* cited by examiner

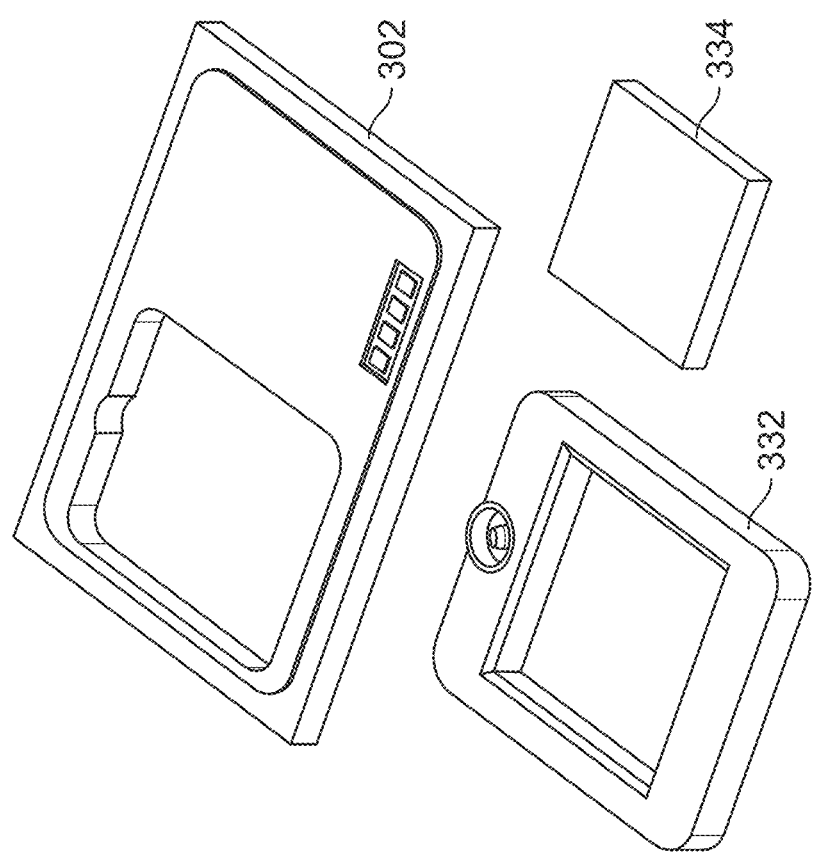

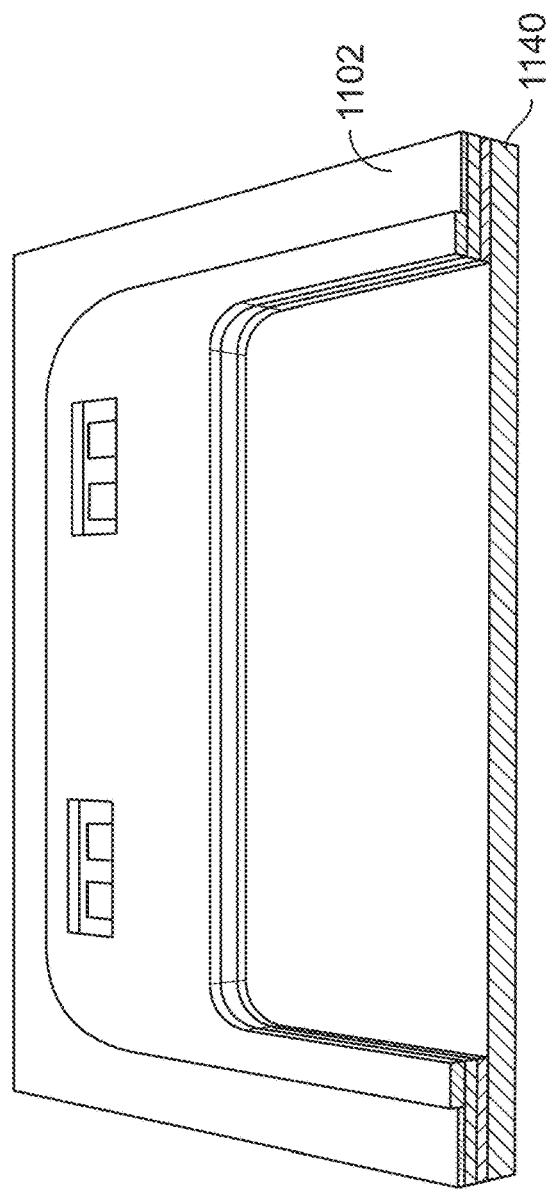
FIG. 11C
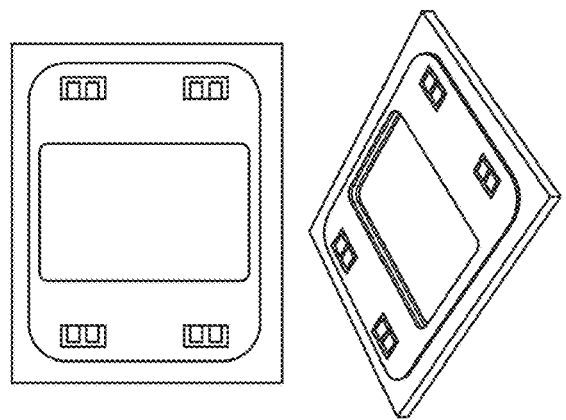

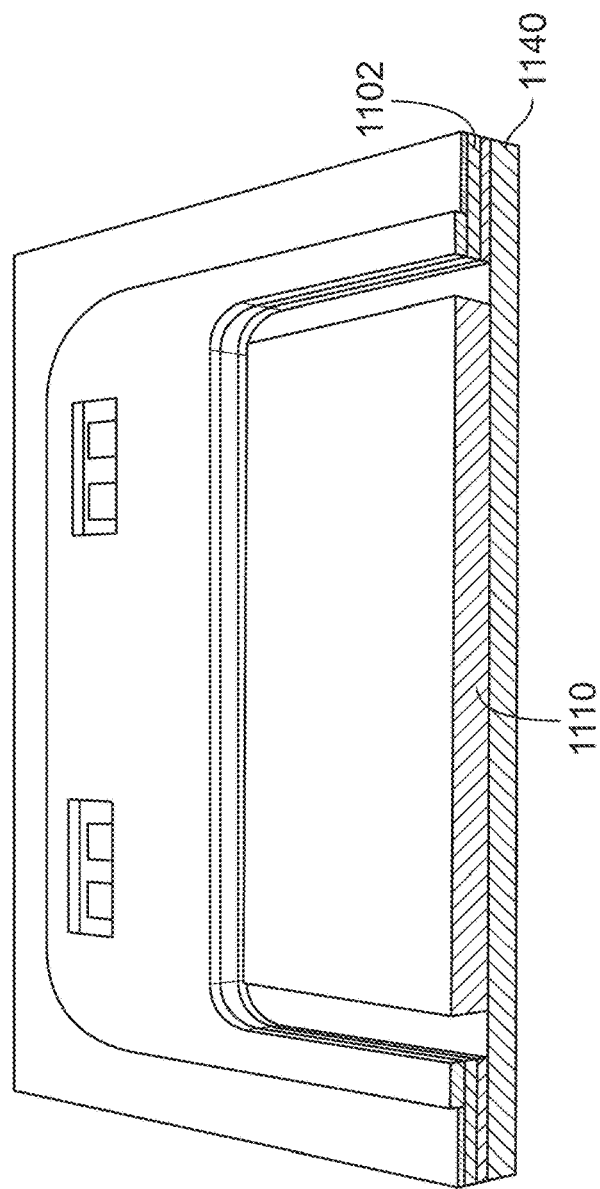
FIG. 11D
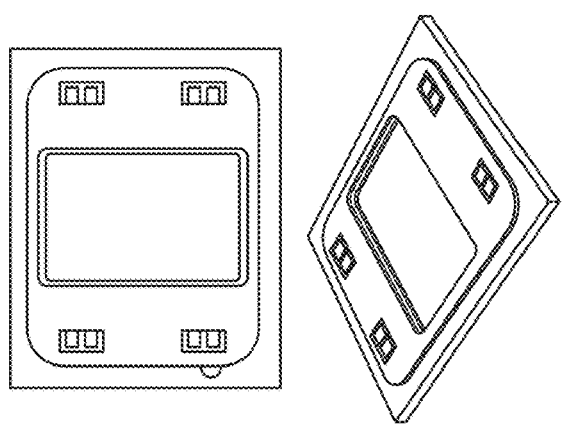

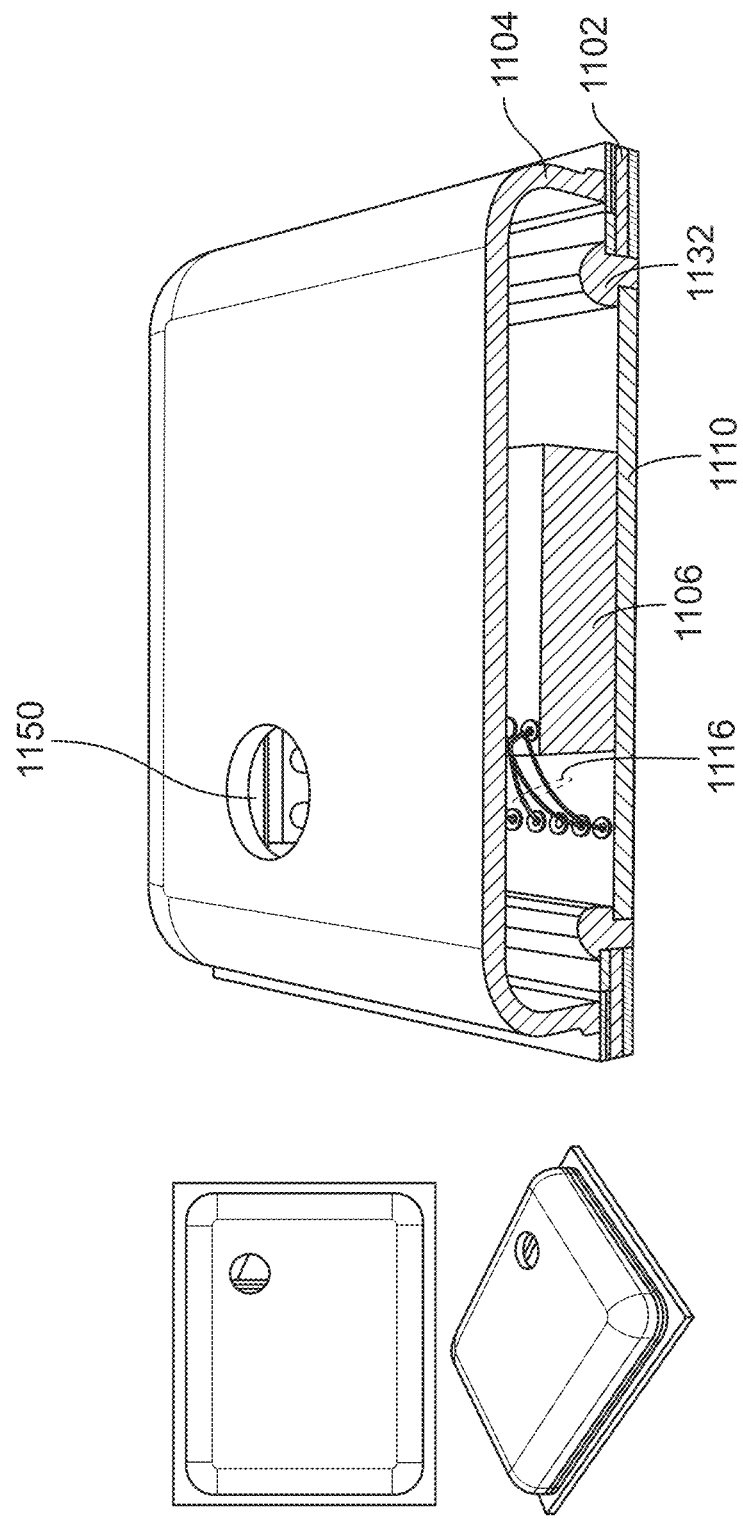

MEMS STRESS REDUCTION STRUCTURE EMBEDDED INTO PACKAGE

BACKGROUND

Mobile and smart devices are proliferating to ever more environments, enabling scores of applications such as navigation, fitness tracking, home automation, and vehicular controls. Microelectromechanical system (MEMS) sensors provide a multitude of measurements in extremely small packaging and in a wide variety of devices and end-use environments. For example, MEMS microphones, pressure sensors, accelerometers, gyroscopes, and ultrasonic sensors are able to monitor sound and voice commands, pressure, linear acceleration, angular velocity, and external physical proximity and structure. As MEMS sensors are placed into increasingly diverse and challenging environments, and used for increasingly critical functions such as vehicle navigation and control, MEMS sensors must remain within tight specifications in widely divergent environmental and use conditions, such as varying temperatures and applied external stresses.

A MEMS sensor is typically provided within a MEMS sensor package that includes the MEMS sensor, internal or external processing circuitry for the MEMS sensor, and a laminate (e.g., board) to provide physical support to the MEMS sensor and processing circuitry, provide for physical coupling with other components of the end-use device, and provide wired electrical connections to the other components of the end-use device. For example, a MEMS sensor and associated processing circuitry may be located on an upper surface of the laminate and wired electrical connections (e.g., power, ground, and various signal lines) are provided to the processing circuitry and/or MEMS sensor via traces within the laminate and wire bonds. During sensor operation, conditions such as changes in temperature may occur that have differing effects on the respective materials of the MEMS sensor package, for example, based on different coefficients of thermal expansion of the materials of the laminate versus the material of the MEMS sensor. This may cause countervailing stresses on the movable components within the MEMS sensor package, resulting in errors in the measurements by the MEMS sensor.

SUMMARY

In an embodiment of the present disclosure, a microelectromechanical system (MEMS) sensor package comprises a laminate base layer comprising a through-hole opening perpendicular to an upper surface of the laminate base layer, wherein the through hole comprises one or more internal edge surfaces. The MEMS sensor package further comprises a resin layer adhered to and covering the internal edge surfaces of the through hole and a MEMS support layer adhered to and surrounded by the resin layer within the through hole, wherein an upper surface of the MEMS support layer is parallel to the upper surface of the laminate base layer. The MEMS layer further comprises a MEMS structure adhered to the upper surface of the MEMS support layer.

In an embodiment of the present disclosure, a device comprises a laminate base layer comprising a through-hole opening perpendicular to an upper surface of the laminate base layer, wherein the through hole comprises one or more internal edge surfaces, a resin layer adhered to and covering the internal edge surfaces of the through hole, and a MEMS support layer adhered to and surrounded by the resin layer within the through hole, wherein an upper surface of the MEMS support layer is parallel to and recessed with respect to the upper surface of the laminate base layer.

In an embodiment of the present disclosure, a method comprises providing a laminate base layer, wherein the laminate base layer comprises a through-hole opening perpendicular to an upper surface of the laminate base layer, wherein the through hole comprises one or more internal edge surfaces. The method further comprises placing, within the through-hole of the laminate base layer, a MEMS support layer, and depositing, in the through-hole between the MEMS support layer and the laminate base layer, a resin layer, wherein the resin layer is adhered to the MEMS support layer and the laminate base layer such that the MEMS support layer is coupled to the laminate base layer via the resin layer.

BRIEF DESCRIPTION OF DRAWINGS

The above and other features of the present disclosure, its nature, and various advantages will be more apparent upon consideration of the following detailed description, taken in conjunction with the accompanying drawings in which:

FIG. 3B shows an illustrative exploded view of the laminate, resin layer, and MEMS support layer of FIG. 3A in accordance with an embodiment of the present disclosure;

FIG. 11C shows an illustrative step of taping the laminate of the MEMS pressure sensor of FIG. 11A in accordance with an embodiment of the present disclosure;

FIG. 11C shows an illustrative step of placing an application specific integrated circuit MEMS support layer for the MEMS pressure sensor of FIG. 11A in accordance with an embodiment of the present disclosure;

FIG. 11D shows an illustrative step of placing an application specific integrated circuit (ASIC) MEMS support layer for the MEMS pressure sensor of FIG. 11A in accordance with an embodiment of the present disclosure;

FIG. 11H shows an illustrative step of providing wirebonds to a MEMS structure and placing a cap over the MEMS structure and ASIC MEMS support layer of the MEMS pressure sensor of FIG. 11A in accordance with an embodiment of the present disclosure.

DETAILED DESCRIPTION OF DRAWINGS

A MEMS device may be packaged on a base layer, such as a laminate base layer. The laminate base layer provides for physical and electrical attachment to other components of an end-use device, such as providing output signals for further processing (e.g., inertial measurements, microphone outputs, pressure signals, etc.) and receiving control or communication signals from other devices. The laminate base layer, by virtue of being physically attached to other components, will be subject to forces received via these other components, which in turn may by transmitted through the laminate base layer. Energy such as heat energy may also be transferred to the laminate base layer, and my propagate through the laminate base layer, causing thermal expansion and/or contraction of the laminate base layer.

A MEMS structure such as a MEMS inertial sensor (e.g., accelerometer and/or gyroscope), MEMS microphone, MEMS pressure sensor, micro-mirror, or ultrasonic sensor may be coupled to and indirectly supported by the laminate base layer. In an embodiment, the coupling of the MEMS structure to the laminate base layer may be indirect via an intervening resin layer and MEMS support layer. Rather than attaching the MEMS structure directly to the laminate base layer or to a component that is rigidly connected to the laminate base layer, the MEMS structure is adhered to a MEMS support layer. The MEMS support layer in turn is located within a through hole of the laminate base layer, and coupled to the laminate base layer via a resin layer that adheres to both the laminate base layer and the MEMS support layer. The resin layer is relatively flexible, such that physical forces (e.g., board stress) experienced by the laminate base layer are dissipated within the resin layer. Furthermore, the resin layer may have thermal properties that support the dissipation of heat energy from the laminate base layer.

The MEMS support layer is constructed of a material such as a low coefficient of thermal expansion material (e.g., a ceramic) or a material having a similar coefficient of thermal expansion to the MEMS structure (e.g., a silicon layer, or processing substrate such as a CMOS substrate), to further prevent any thermal energy that is not dissipated by the resin layer from having a significant effect on the MEMS structure. In some embodiments, the MEMS support layer may have a reduced height with respect to the laminate base layer, which may allow the for the MEMS structure to be partially recessed with respect to the laminate base layer. A recessed MEMS structure may allow for the overall height of the MEMS package to be reduced, such as by reducing the clearance needed by a lid of the sensor package. The MEMS support layer may include other features depending on the type of attached MEMS structure. For example, a MEMS support layer for a MEMS microphone may include a port for providing acoustic signals to a front cavity of a microphone-type MEMS structure.

Figure 1:
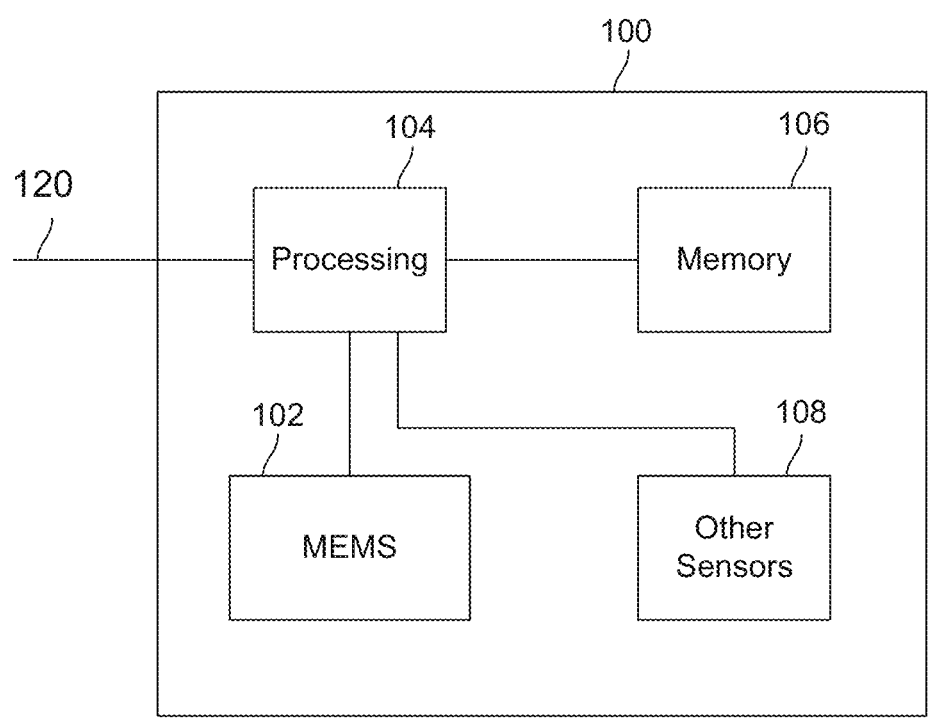
FIG. 1 shows an illustrative MEMS microphone package in accordance with an embodiment of the present disclosure.

FIG. 1 depicts an exemplary MEMS system 100 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the MEMS system may include at least a MEMS sensor 102 (e.g., a microphone, pressure sensor, accelerometer, gyroscope, ultrasonic sensor, etc.) and supporting circuitry, such as processing circuitry 104 and memory 106. In some embodiments, one or more additional sensors 108 (e.g., additional microphones, pressure sensors, accelerometers, gyroscopes, ultrasonic sensors, etc.) may be included within the MEMS system 100 to provide an integrated multi-parameter sensing package.

Processing circuitry 104 may include one or more components providing necessary processing based on the requirements of the MEMS system 100. In some embodiments, processing circuitry 104 may include hardware control logic that may be integrated within a chip of a sensor (e.g., on a substrate or capacitor of a MEMS sensor 102 or other sensor 108, or on an adjacent portion of a chip to the MEMS sensor 102 or other sensor 108) to control the operation of the MEMS sensor 102 or other sensors 108 and perform aspects of processing for the MEMS sensor 102 or other sensors 108. In some embodiments, the MEMS sensor 102 and other sensors 108 may include one or more registers that allow aspects of the operation of hardware control logic to be modified (e.g., by modifying a value of a register). In some embodiments, processing circuitry 104 may also include a processor such as microprocessor that executes software instructions, e.g., that are stored in memory 106. The microprocessor may control the operation of the MEMS sensor 102 by interacting with the hardware control logic, and process signals received from MEMS sensor 102. The microprocessor may interact with other sensors in a similar manner. In some embodiments, some or all of the functions of the processing circuitry 104, and in some embodiments, of memory 106, may be implemented on an application specific integrated circuit ("ASIC").

Although in some embodiments (not depicted in FIG. 1), the MEMS sensor 102 or other sensors 108 may communicate directly with external circuitry (e.g., via a serial bus or direct connection to sensor outputs and control inputs), in an embodiment the processing circuitry 104 may process data received from the MEMS sensor 102 and other sensors 108 and communicate with external components via a communication interface 110 (e.g., a SPI or I2C bus, in automotive applications a controller area network (CAN) or Local Interconnect Network (LIN) bus, or in other applications suitable wired or wireless communications interfaces as is known in the art). The processing circuitry 104 may convert signals received from the MEMS sensor 102 and other sensors 108 into appropriate measurement units (e.g., based on settings provided by other computing units communicating over the communication interface 110) and perform more complex processing such as combining signals from multiple microphones and/or other sensors, and in some embodiments, to determine from received data whether a particular activity (e.g., speech, voice commands, etc.) is taking place. In some embodiments, some or all of the conversions or calculations may take place on the hardware control logic or other on-chip processing of the MEMS sensor 102 or other MEMS sensors 108.

In some embodiments, certain types of information may be determined based on data from multiple MEMS sensors 102 and other sensors 108, in a process that may be referred to as sensor fusion. By combining information from a variety of sensors it may be possible to accurately determine information that is useful in a variety of applications, such as speech recognition, voice control, image stabilization, navigation systems, automotive controls and safety, dead reckoning, remote control and gaming devices, activity sensors, 3-dimensional cameras, industrial automation, and numerous other applications.

An exemplary MEMS sensor 102 may include one or more movable components that move relative to fixed components to measure a force of interest, such as a diaphragm that responds to sound or pressure or proof masses that respond to linear acceleration or angular velocity. In some embodiments, the MEMS sensor 102 may be part of a MEMS package that that includes some or all of the processing circuitry, e.g., as an ASIC located within a portion of a cavity of the MEMS package. The MEMS package may include a laminae base layer that provides structural support and physical and/or electrical connection to other devices. The MEMS sensor may be located on a MEMS support layer, which in turn is coupled to and located within the laminate base layer via a flexible resin layer. The flexible resin layer absorbs and/or decouples stresses from the laminate base layer, preventing such stresses from being transmitted to the MEMS sensor.

Figure 2:
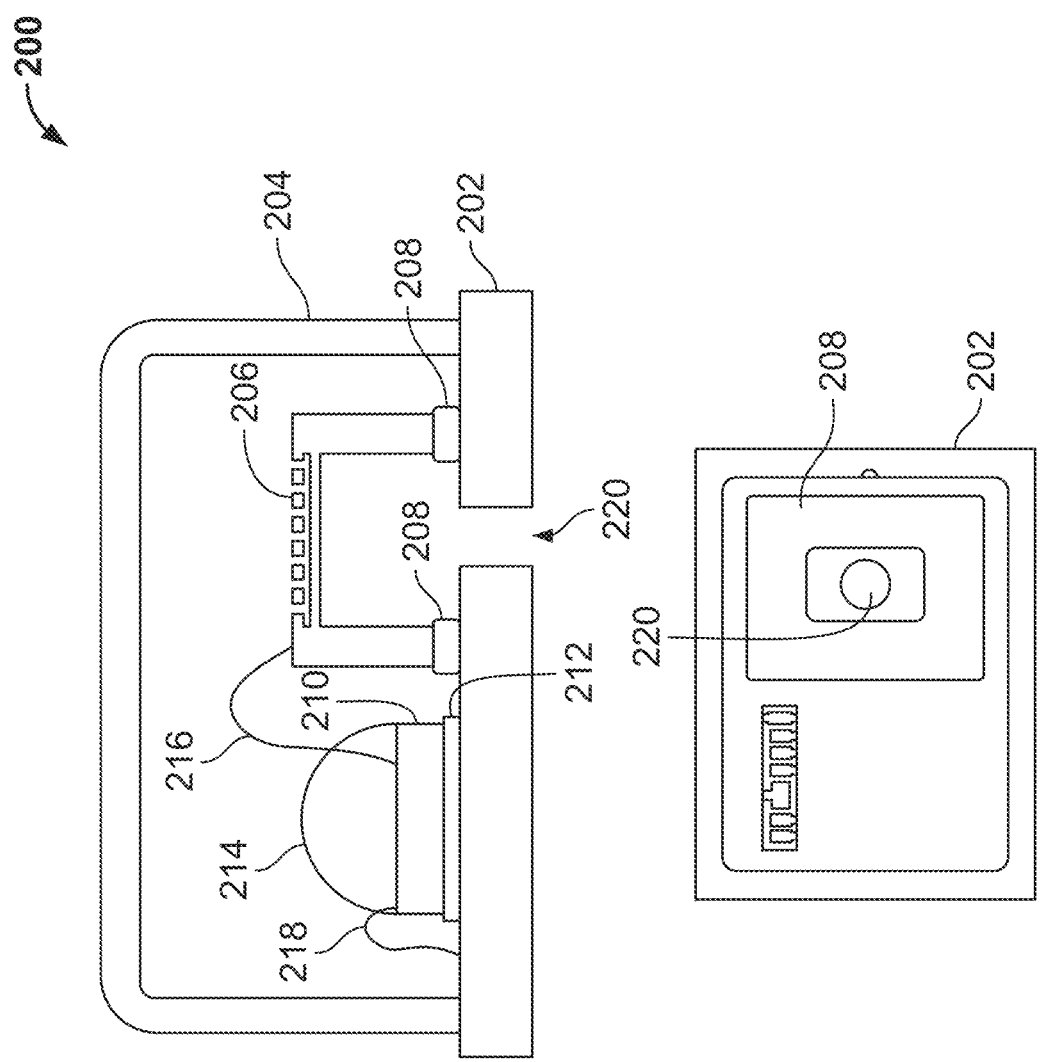
FIG. 2 shows an illustrative MEMS sensor package including a MEMS structure adhered to a laminate in accordance with an embodiment of the present disclosure.

FIG. 2 shows an illustrative MEMS sensor package 200 including a MEMS structure 206 adhered to a laminate base layer 202 in accordance with an embodiment of the present disclosure. Although a variety of types of MEMS sensors (e.g., microphones, pressure sensors, accelerometers, gyroscopes, ultrasonic sensors, etc.) may be encompassed within the scope of the present disclosure, in the embodiment of FIG. 2 the MEMS sensor included within the MEMS sensor package 200 may be a MEMS microphone. Although a MEMS microphone may be configured in a variety of manners, the MEMS microphone package 200 of FIG. 2 may include a laminate base layer 202, a cap or lid 204, a MEMS microphone structure 206, and an ASIC 210.

The MEMS microphone structure 206 may include a diaphragm (not pictured in detail) that responds to acoustic energy received within a front volume via a port 220, which may be implemented as a through hole in the laminate base layer. A back volume (e.g., the volume contained within the lid, on the opposite side of the MEMS microphone structure 206 from the front volume) may include the ASIC 212. Signals from the MEMS microphone structure 206 (e.g., corresponding to a capacitance representative of the movement of the diaphragm relative to a fixed surface of the MEMS microphone structure) are provided to the ASIC 210 via wirebond(s) 216. The ASIC processes the received signals such that they are suitable for transmission to other components and or devices via wirebond(s) 218 and via electrical connections within the laminate base layer 202 (not depicted).

The ASIC 210 and the MEMS microphone structure 206 may be adhered to the laminate base layer by respective glue layers 212 and 208. ASIC 210 may also include a protective layer 214. During real-world operation and usage, the laminate base layer 202 may undergo stresses such as due to packaging with other components, stresses imparted on the end-use device directly, and/or thermal stresses (e.g., due to changes or extremes in temperature). These stresses may be transmitted to the MEMS microphone structure 206 via glue layer 208, which in turn may cause errors in the measurement of the force of interest (e.g., in the example of a MEMS microphone structure, an acoustic signal). Accordingly, particular glue types such a low Young modulus glue layer 208 or a high bond line thickness ("BLT") glue layer 208 may be used to limit the coupling of stresses between the laminate base layer 202 and the MEMS microphone structure 206. Such glue layers 208 may require a relatively large amount of glue material, resulting in glue bleeding (e.g., due to amount of glue or relatively low viscosity glue) or a relatively thick glue layer, which limits the ability to lower package height and/or results in difficulty achieving low tolerances in front volume.

Figure 3A:
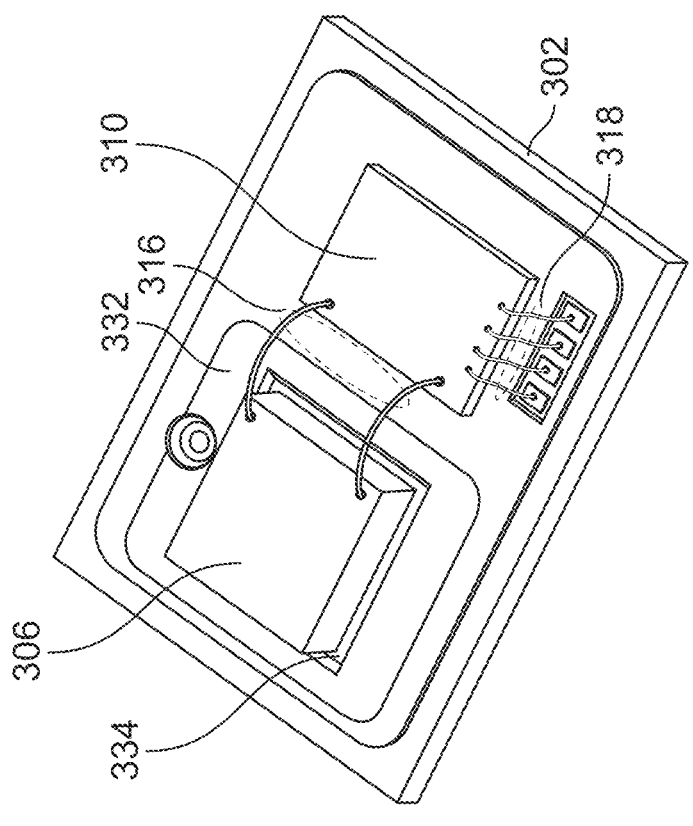
FIG. 3A shows an illustrative MEMS sensor package including an integrated resin layer and MEMS support layer in accordance with an embodiment of the present disclosure.
Figure 3A:
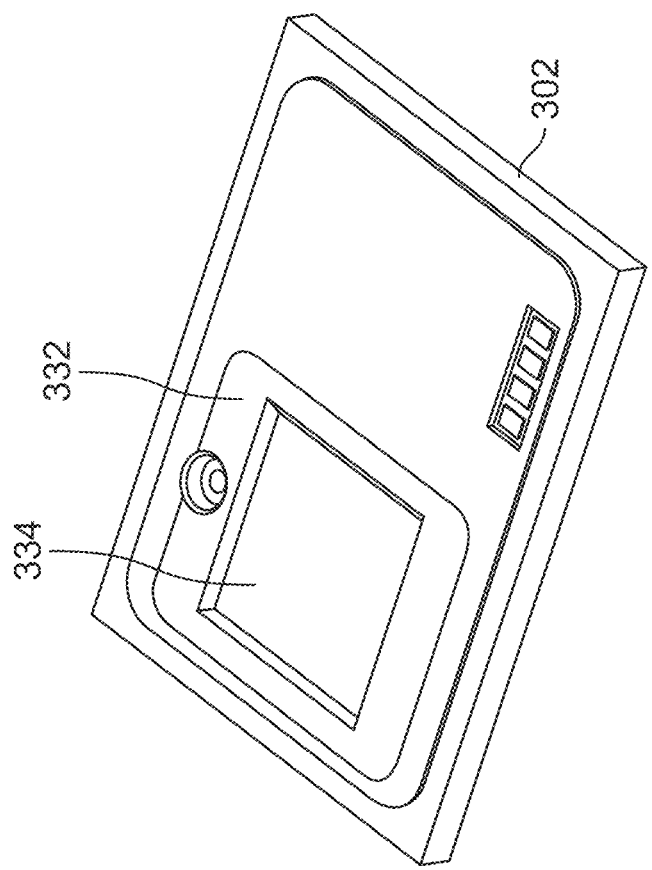

FIG. 3A shows an illustrative MEMS sensor package including an integrated resin layer and MEMS support layer in accordance with an embodiment of the present disclosure. On the left-side portion of FIG. 3A, a laminate base layer 302 is depicted with an integrated resin layer 332 inserted within a portion of the laminate base layer 302 that generally corresponds to a location of a MEMS sensor. The integrated resin layer 332 is adhered to an inner surface of the laminate base layer 302 and provides an effective buffer from the transfer for forces and/or heat energy from the laminate base layer 302 to a MEMS sensor, as described herein. Although a resin layer 332 may be deposited within and adhered to the laminate base layer 302 in a variety of manners, in an embodiment the resin layer 332 may be applied such as by injection molding (e.g., cavity direct injection molding) process. A resin layer may be a plastic or polymers that is suitable for forming via injection molding, able to fill narrow and/or small cavities and gaps, and may providing shielding and/or protection from the environment to components that are entirely or partially coated or covered. Exemplary materials of the resin layer 332 may include a Sumitomo Bakelite Co., Ltd. Sumikon® EME-G700LA Type L-A resins, or materials having similar thermal and/or structural properties.

Figure 3C:
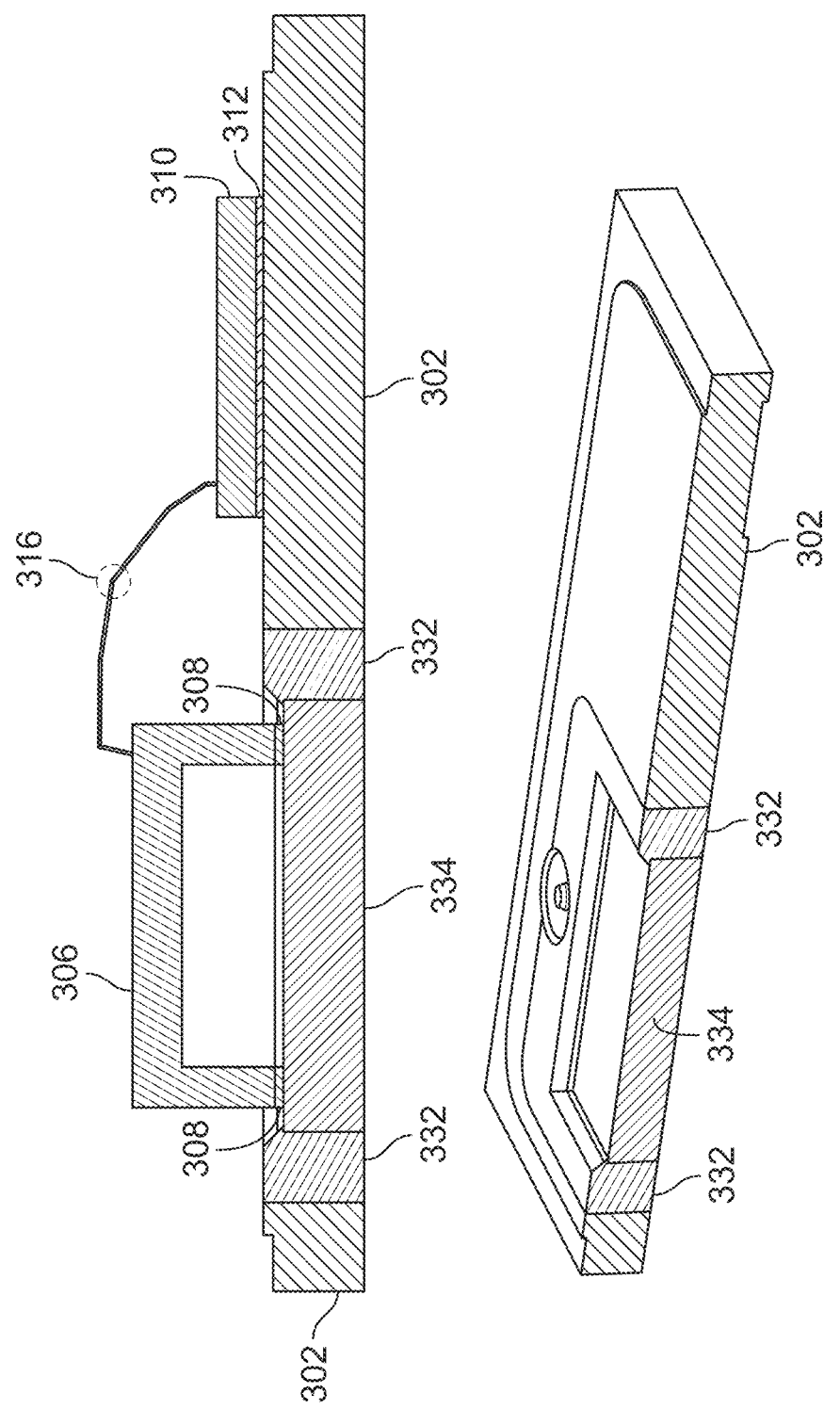
FIG. 3C shows an illustrative section view of the MEMS sensor package of FIG. 3A in accordance with an embodiment of the present disclosure.

A MEMS support layer 334 may be adhered to an inner edge surface of the resin layer 332, and may provide a supporting surface for a MEMS structure 306. In the embodiment of FIGS. 3A-3C, the MEMS structure 306 is depicted in a simplified manner, but can include any suitable MEMS structure. An exemplary MEMS support layer 334 material such as silicon may provide suitable rigid support for the MEMS structure 306 and may have a coefficient of thermal expansion (CTE) that is similar to the materials of the MEMS structure 306, although in some embodiments the MEMS support layer structure can be made of other materials, including at least a portion of the MEMS support layer including electrically active processing circuitry, a ceramic layer, or a low-CTE material. In an exemplary embodiment the CTE of the material of the MEMS support layer may be 4*10−6 m/(m ° C.) or less. The MEMS support layer 334 may be substantially isolated from the laminate base layer 302 by the resin layer 332 such that stresses and/or other energy (e.g., thermal energy) is substantially dissipated within the resin layer 332. In this manner, the MEMS structure 306 may be also be substantially isolated from stresses experienced by the laminate base layer 302, and further, may not require design features such as a low Young modulus glue layer or a high bond line thickness ("BLT") glue layer, such that the glue/adhesive used to attach the MEMS structure 306 to the MEMS support layer 334 is substantially thinner than configurations where glue is used to dissipate stresses transferred from the laminate base layer 302. An ASIC 310 is attached to the laminate base layer 302 via an adhesive (not depicted in FIG. 3A, and is connected respectively to the MEMS structure 306 via wirebonds 316 and to the electrical connections of the laminate base layer via wirebonds 318. Although not depicted in FIG. 3A or other figures herein, in some embodiments the ASIC or other processing circuitry may also be adhered to the MEMS support layer 334, or to a separate support layer. This may help to dissipate the transfer of heat energy from the laminate base layer to the ASIC or other processing circuitry.

FIG. 3B shows an illustrative exploded view of the laminate, resin layer, and MEMS support layer of FIG. 3A in accordance with an embodiment of the present disclosure. As depicted in FIG. 3B, the laminate base layer 302 includes a through hole suitably shaped such that the inward-facing edges of the through hole engage with the resin layer 332, such as through an insertion and adhesion process or a cavity direct injection molding process. Although a generally rectangular shape for the through hole of the laminate base layer 302 is depicted in FIG. 3B, other suitable shapes (e.g., oval, polygon, etc.) may be used in other embodiments, such as for desired stress dissipation and/or manufacturing characteristics. The resin layer 332 may itself include a through hole having a suitable shape for fixedly attachment of the MEMS support layer 334, such as by insertion and adhesion to the resin layer 332. Although a generally rectangular shape for the through hole of the resin layer 332 is depicted in FIG. 3B, other suitable shapes (e.g., oval, polygon, etc.) may be used in other embodiments, such as for desired stress dissipation and/or manufacturing characteristics. In some embodiments the through hole of the resin layer may be tapered (e.g., to retain the MEMS support layer 334 within the resin layer 332) and/or recessed (e.g., to reduce a height of the overall MEMS structure 306 by lowering an upper plane of the MEMS support layer 332 relative to an upper plane of the laminate base layer 302).

FIG. 3C shows an illustrative section view of the MEMS sensor package of FIGS. 3A and 3B in accordance with an embodiment of the present disclosure. As depicted in FIG. 3C, the laminate base layer 302 may surround the resin layer 332, with the resin layer adhered to an inner surface of the through hole of laminate base layer 302. A MEMS support layer 334 adheres to an inner surface of the through hole of resin insert 332, and in the embodiment of FIG. 3C, is recessed such that an upper plane of the MEMS support layer is located below an upper plane of the laminate base layer 302. The MEMS structure 306 is adhered to the top of the MEMS support layer 334 by a relatively thin glue layer 308. Because the MEMS support layer 334 is recessed relative to the laminate base layer 302 and the glue layer 308 is relative thin, the MEMS structure have a relatively low profile within the MEMS package, such that a cap or lid (not depicted in FIG. 3C) having a shorter height and smaller internal volume may be used in some embodiments. Signals from the MEMS structure 306 are provided to ASIC 310 such as by wirebonds 316. The ASIC 310 is adhered to the laminate base layer 302 by an adhesive 312.

Figure 4:
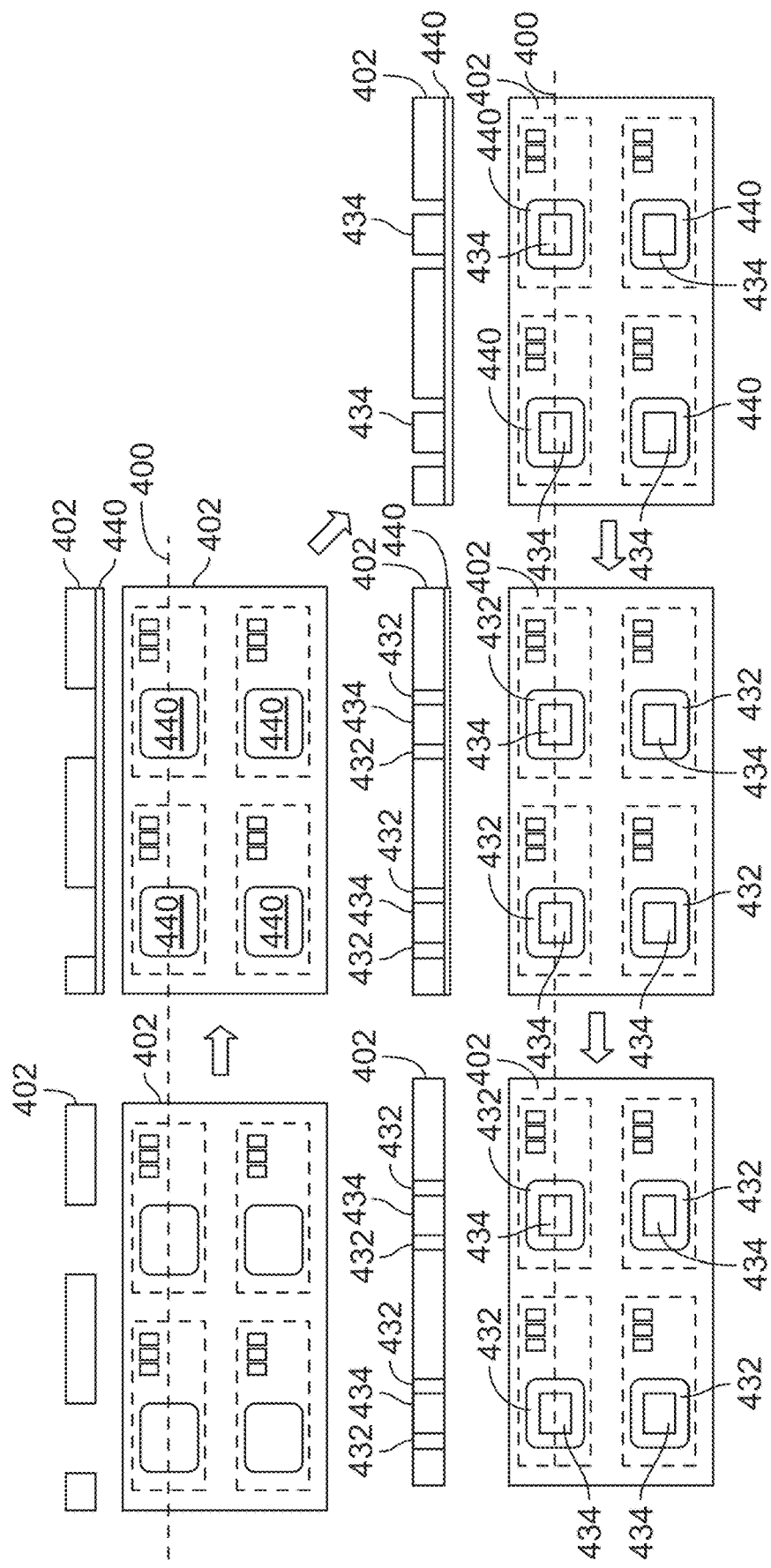
FIG. 4 shows steps of an illustrative manufacturing process of a MEMS sensor package including an embedded resin layer and MEMS support layer in accordance with an embodiment of the present disclosure.

FIG. 4 shows steps of an illustrative manufacturing process of a MEMS sensor package including an embedded resin layer and MEMS support layer in accordance with an embodiment of the present disclosure. Although a particular set of steps is depicted in a particular sequence in FIG. 4, it will be understood that one or more steps may be added or omitted and that the sequences of steps may be modified. Although the steps of FIG. 4 may be described within the context of a MEMS structure as described herein, it will be understood that the present steps apply to other types devices and sensors that respond in undesired ways in response to physical and/or other stresses on an adjacent laminate base layer.

In the exemplary processing of FIG. 4, processing moves clockwise from the upper-left figure to the lower-left figure. Each step in FIG. 4 is depicted as a top view and section view, with the corresponding section view for each top view depicted above the top view, based on the section lines 400. In the first step of the process, a laminate base layer wafer 402 for four individual MEMS sensors is depicted, including through holes corresponding to eventual locations of MEMS structures and electrical contacts for eventual wirebonding to an ASIC (e.g., to eventually be placed adjacent to each of the through holes and electrical contacts). It will be understood that the particulars of the wafer 402 (e.g., shape, number of devices, location of through holes, location of electrical contacts, end-use device) are exemplary only, and may be modified based on particular manufacturing processes and/or end-use devices.

Once an appropriate laminate base layer wafer 402 has been acquired, processing may continue to the next step, at which a fabrication base layer 440 (e.g., a taping layer) may be applied over the laminate base layer wafer 402, including to cover the through holes of the laminate base layer wafer 402. In an exemplary embodiment, and for simplicity of manufacturing, the entire bottom side of the laminate base layer wafer 402 (e.g., opposite where the MEMS structure and ASIC will eventually be placed) is covered by the fabrication base layer 440 such as by taping the entire bottom side of the laminate base layer wafer 402, although it will be understood that in some embodiments only certain portions of the laminate base layer wafer 402 may be covered by the fabrication base layer 440, for example, such that each of the through holes of the laminate base layer wafer 402 is covered for later placement and molding steps.

Once a fabrication base layer 440 has been applied to the laminate base layer wafer 402, the processing may continue to the next step, at which a respective MEMS support layer 434 is placed on the fabrication base layer 440 within each of the through holes of the laminate base layer wafer 402. In an exemplary embodiment, the shape of each MEMS support layer 434 generally corresponds to the shape of the through holes of the laminate base layer wafer 402 and is placed at a center point in the through holes, although in other embodiments (not depicted) different shapes and placement locations may be provided, for example, to achieve desired stress/temperature dissipation effects. And in some embodiments (not depicted) a laminate base layer wafer 402 may have multiple different through hole shapes and patterns, such that multiple device types may be concurrently manufactured.

Once the MEMS support layers 434 have bene placed on the fabrication base layer 440 within the through holes of the laminate base layer wafer 402, processing may continue to the next step at which a respective molded resin layer 432 is deposited within the remaining unfilled portions of the through holes of the laminate base layer wafer 402, to fully fill the through holes of the laminate base layer wafer 402. Although the molded resin layer 432 may be deposited in a variety of suitable manners (e.g., pin gate molding or cavity direct injection molding), in an embodiment the molded resin layer 432 may be deposited and cured over the fabrication base layer within the through holes via a cavity direct injection molding process. The molded resin layer 432 adheres to the inward-facing edges of the respective through holes of the laminate base layer wafer 402 and the outward-facing edges of the respective MEMS support layers 434, permanently attaching to each of the laminate base layer wafer 402 and MEMS support layers 434. Once the depositing and curing of the molded resin layer 432 is complete, at the next step the fabrication base layer 440 (e.g., tape layer) may be removed, resulting in a wafer of partially manufactured laminate base layers 402 including the molded resin layers 432 and MEMS support layers 434. In subsequent operations (not depicted in FIG. 4), additional components (e.g., MEMS structures, ASICs, lids, wirebonds, etc.) may be added to the partially manufactured wafers to create completed components, the wafer may be diced into respective completed or partially completed dies, as appropriate.

Figure 5:
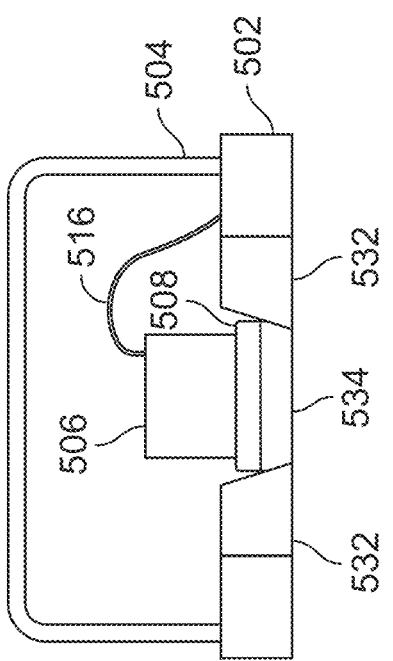
FIG. 5 shows an illustrative MEMS sensor package including a recessed MEMS support layer in accordance with an embodiment of the present disclosure.

FIG. 5 shows an illustrative MEMS sensor package including a recessed MEMS support layer in accordance with an embodiment of the present disclosure. Although a particular set of components are depicted in FIG. 5, it will be understood that the MEMS sensor package may include other non-depicted components (e.g., an ASIC, instead of or in addition to an electrically active base layer 502), and that certain components may be removed or substituted. Although FIG. 5 is described in the context of a MEMS sensor package, it will be understood that other (e.g., non-MEMS) devices may utilized a recessed support layer in other embodiments.

A MEMS sensor package may include a base layer 502, which in the embodiment of FIG. 5, may be an active CMOS substrate layer including analog and digital processing circuitry within the base layer 502 or portions thereof, thus performing both processing and structural support functions within the MEMS sensor package. The base layer 502 includes a through hole and a resin layer 532 (e.g., a molded resin layer) is adhered to inward-facing surfaces of the through hole. The resin layer has an inward sloping inner surface, which in turn is adhered to sloped outward-facing surfaces of a MEMS support layer 534 (e.g., a MEMS support layer 534 including inward-sloping outward-facing surfaces is placed during manufacturing, and resin layer 532 is deposited around the MEMS support layer 534 to fully fill the remaining portions of the base layer 502 through hole). As depicted in FIG. 534, the height of the MEMS support layer 534 is less than the height of the base layer 502 (e.g., a height of approximately 50% of the height of the base layer 502, although different respective heights may be utilized in other embodiments). In this manner, components attached on the MEMS support layer 534 (e.g., a simplified MEMS structure 506 attached to MEMS support layer 534 by glue layer 508 as depicted in FIG. 5) have a lower overall height than similar components attached on a base layer such as base layer 502. This may allow a cap/lid 504 height to be reduced, or to otherwise achieve desirable characteristics such as increased back volume within a cap/lid 504. The MEMS structure 506 may be attached to processing circuitry (e.g., of active base layer 502 in FIG. 5, or of an ASIC or other circuitry in other embodiments) by wirebonds 516.

Although a single recessed MEMS support layer is depicted in FIG. 5, it will be understood that other configurations of support layer are encompassed by the present disclosure. For example, multiple through holes may be provided in a base layer such as base layer 502, and in some embodiments, respective associated support layers may have different shapes and/or heights, to accommodate different types of components and circuitry attached to the support layers. In some embodiments, a support layer (e.g. a MEMS support layer) may have a height that is greater than the base layer (e.g., laminate base layer or electrically active base layer), for example, to provide a desired vertical location for components within a volume. Further, in some embodiments, the MEMS support layer and resin layer may be employed in applications without a cap/lid or enclosed volume.

Figure 6:
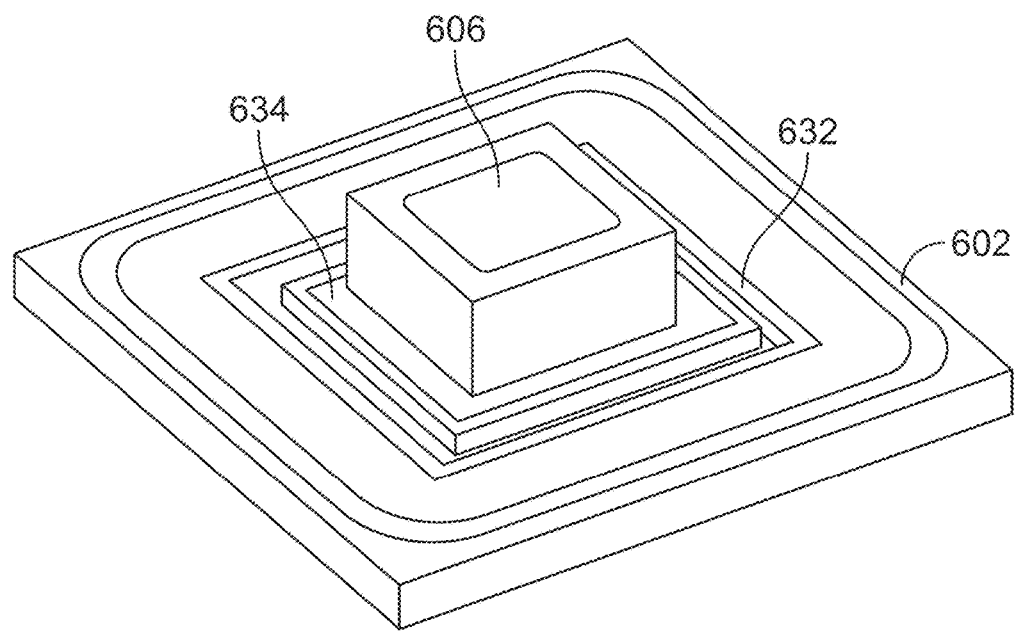
FIG. 6 shows illustrative perspective view and section view of a MEMS sensor package including a grooved resin layer in accordance with an embodiment of the present disclosure.
Figure 6:
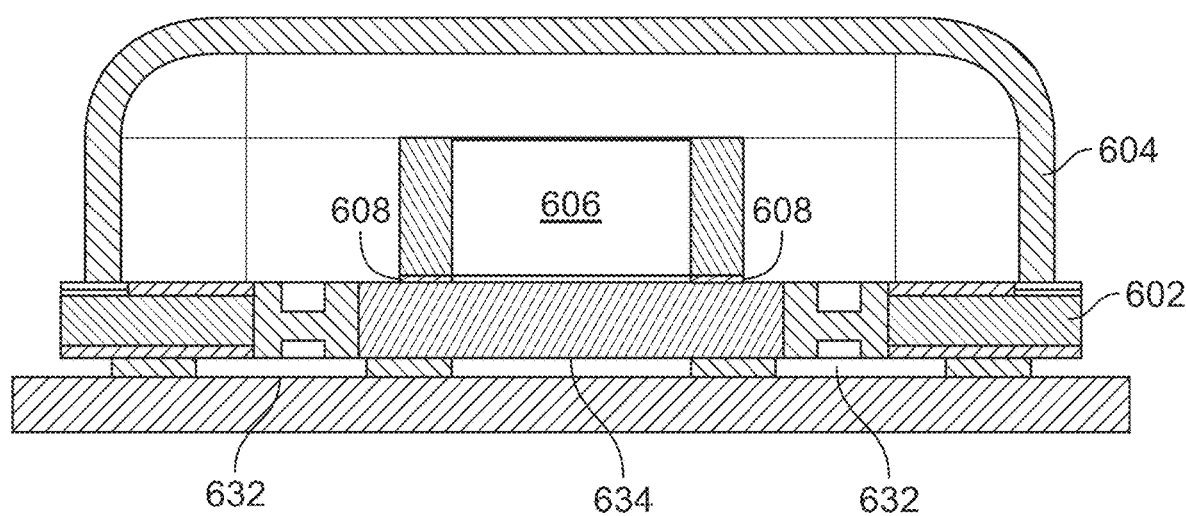

FIG. 6 shows illustrative perspective view and section view of a MEMS sensor package including a grooved resin layer in accordance with an embodiment of the present disclosure. Although it will be understood that components may be added, removed, or substituted from FIG. 6 in a variety of suitable manners, in the exemplary embodiment of FIG. 6, a MEMS sensor package includes a laminate base layer 602, lid 604, resin layer 632, MEMS support layer 634, MEMS structure 606, and adhesive (e.g., glue) layer 608. Although not depicted in FIG. 6, the MEMS sensor package may also include processing circuitry (e.g., an ASIC) and electrical connections (e.g. wirebonds). In the embodiment of FIG. 6, the bottom of the laminate base layer 602 attaches to other components of an end use device. MEMS support layer 634 has approximately the same height as the laminate base layer 602, although the height of the respective layers may differ, as described herein. The resin layer 632 adheres to both the laminate base layer 602 and MEMS support layer 634, and provides a coupling between the laminate base layer 602 and MEMS support layer 634. As depicted in FIG. 6, the resin layer 632 is patterned with a groove on both the upper and lower side of the resin layer 632. Although a groove is depicted in FIG. 6, it will be understood that other patterns may be applied to the resin layer 632, for example, based on the utilized molding techniques and mold shape. A patterned (e.g., grooved) resin layer 632 may provide properties such as dissipation of forces imparted on the laminate base layer 602 and the reduction of heat transfer from laminate base layer 602 to MEMS support layer 634. A patterned resin layer 632 may also reduce the overall weight of the MEMS sensor package and/or provide desirable properties within a cavity of the MEMS sensor package.

Figure 7:
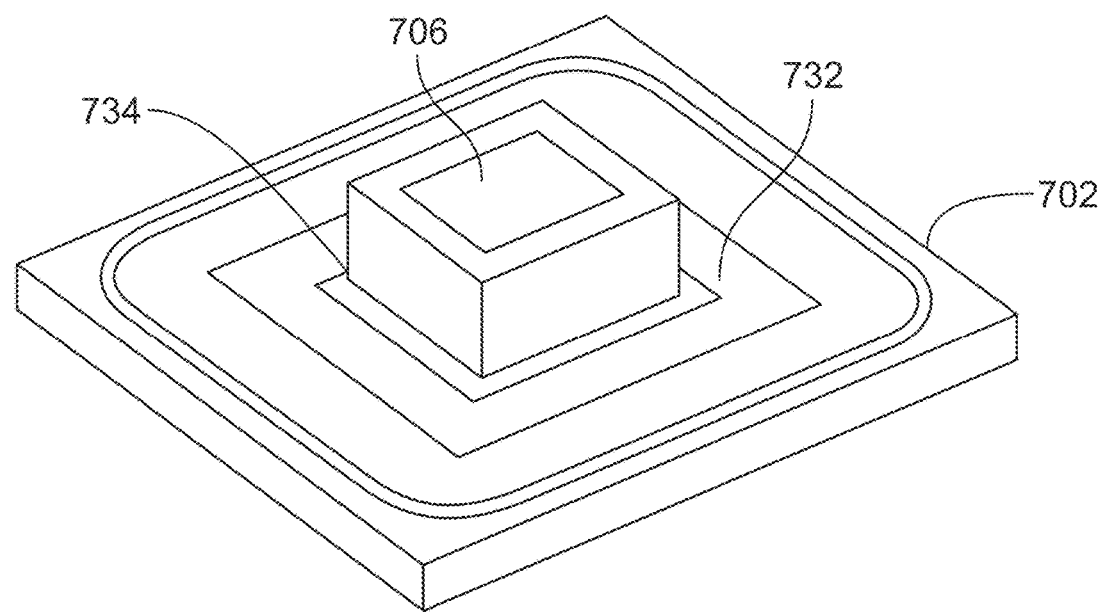
FIG. 7 shows illustrative perspective view and section view of a MEMS sensor package including a solid resin layer in accordance with an embodiment of the present disclosure.
Figure 7:
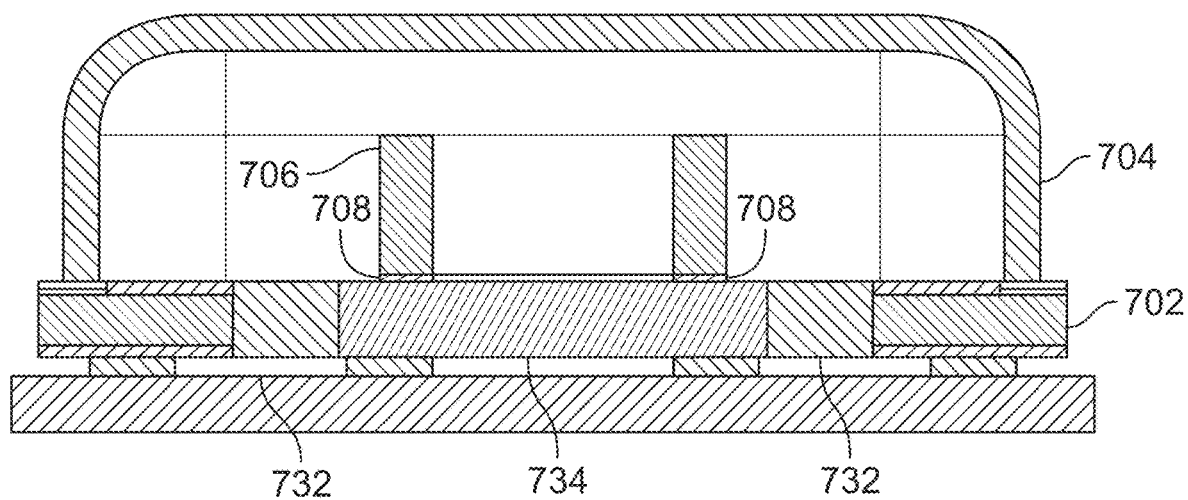

FIG. 7 shows illustrative perspective view and section view of a MEMS sensor package including a solid resin layer in accordance with an embodiment of the present disclosure. Although it will be understood that components may be added, removed, or substituted from FIG. 7 in a variety of suitable manners, in the exemplary embodiment of FIG. 7, a MEMS sensor package includes a laminate base layer 702, lid 704, resin layer 732, MEMS support layer 734, MEMS structure 706, and adhesive (e.g., glue) layer 708. Although not depicted in FIG. 7, the MEMS sensor package may also include processing circuitry (e.g., an ASIC) and electrical connections (e.g. wirebonds). In the embodiment of FIG. 7, the bottom of the laminate base layer 702 attaches to other components of an end use device. MEMS support layer 734 has approximately the same height as the laminate base layer 702, although the height of the respective layers may differ, as described herein. The resin layer 732 adheres to both the laminate base layer 702 and MEMS support layer 734, and provides a coupling between the laminate base layer 702 and MEMS support layer 734. As depicted in FIG. 7, the resin layer 732 is not patterned but instead is a solid layer of non-conductive (e.g., resin) material. A solid resin layer 732 may provide properties such as structural rigidity while still ensuring necessary dissipation of forces imparted on the laminate base layer 702 and the reduction of heat transfer from laminate base layer 702 to MEMS support layer 734.

Figure 8:
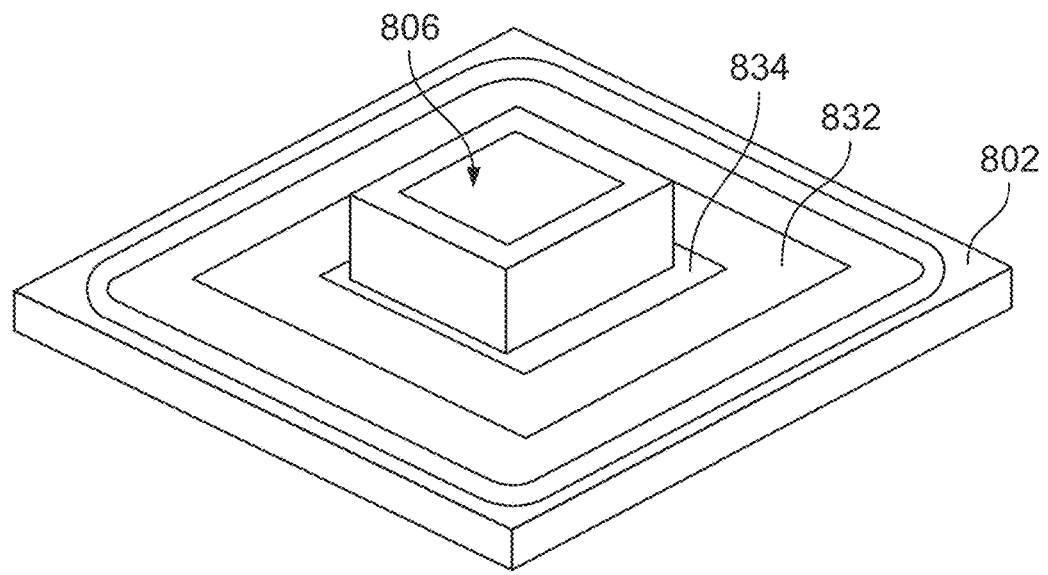
FIG. 8 shows illustrative perspective view and section view of a MEMS sensor package including a recessed resin layer in accordance with an embodiment of the present disclosure.
Figure 8:
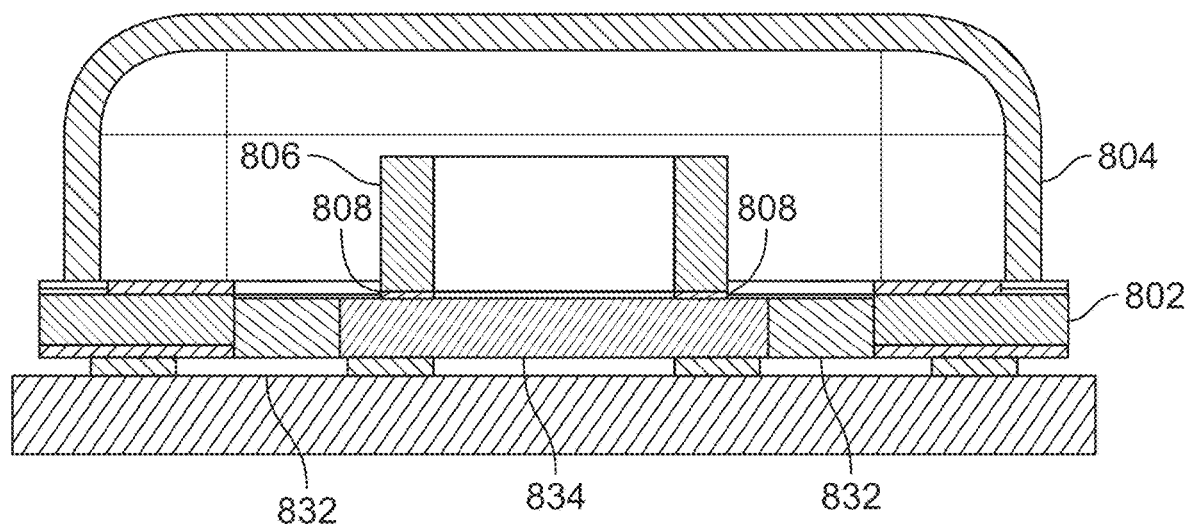

FIG. 8 shows illustrative perspective view and section view of a MEMS sensor package including a recessed resin layer in accordance with an embodiment of the present disclosure. Although it will be understood that components may be added, removed, or substituted from FIG. 8 in a variety of suitable manners, in the exemplary embodiment of FIG. 8, a MEMS sensor package includes a laminate base layer 802, lid 804, resin layer 832, MEMS support layer 834, MEMS structure 806, and adhesive (e.g., glue) layer 808. Although not depicted in FIG. 8, the MEMS sensor package may also include processing circuitry (e.g., an ASIC) and electrical connections (e.g. wirebonds). In the embodiment of FIG. 8, the bottom of the laminate base layer 802 attaches to other components of an end use device. MEMS support layer 834 has a reduced height with respect to laminate base layer 802, such that the MEMS structure 806 is recessed with respect to laminate base layer 802. The resin layer 832 also has a reduced height, adheres to both the laminate base layer 802 and MEMS support layer 834, and provides a coupling between the laminate base layer 802 and MEMS support layer 834. As depicted in FIG. 8, the resin layer 832 is not patterned but instead is a solid layer of non-conductive (e.g., resin) material.

Figure 9:
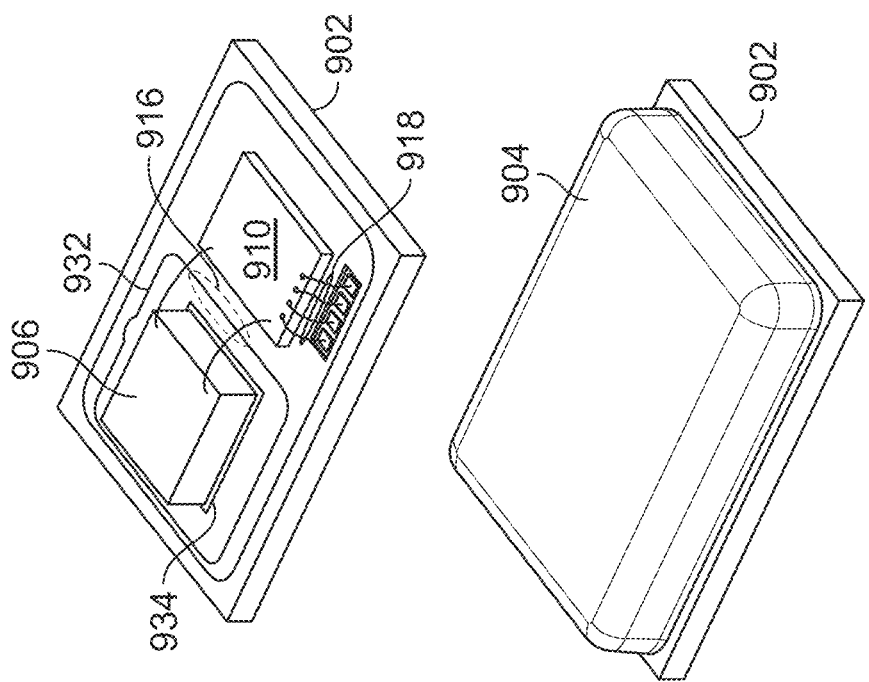
FIG. 9 shows an illustrative perspective view and section view of a MEMS microphone package including a resin layer and MEMS support layer in accordance with an embodiment of the present disclosure.
Figure 9:
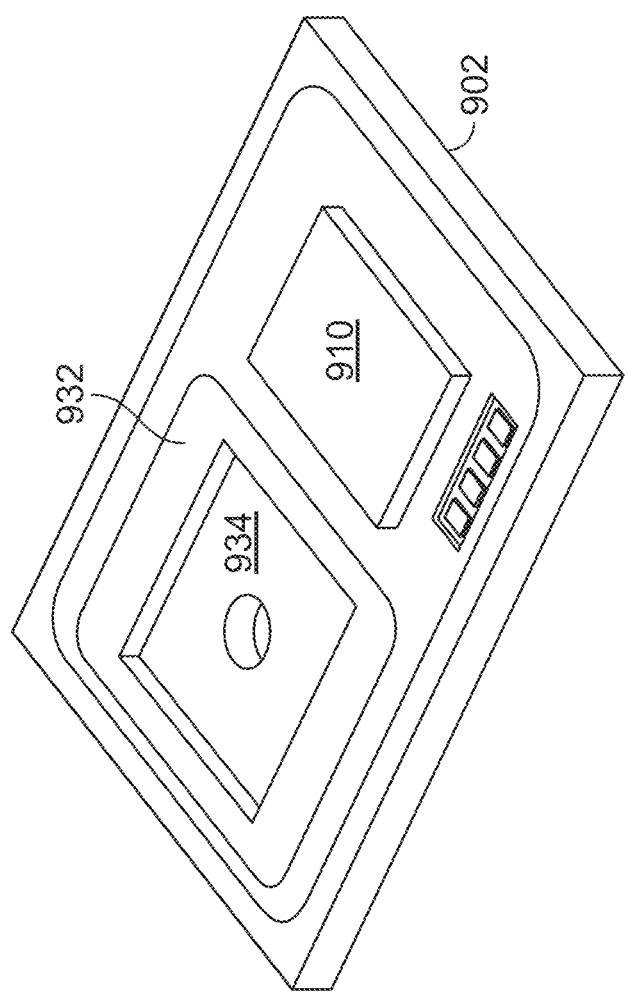

FIG. 9 shows an illustrative perspective view and section view of a MEMS microphone package including a resin layer and MEMS support layer in accordance with an embodiment of the present disclosure. Although it will be understood that components may be added, removed, or substituted from the microphone of FIG. 9 in a variety of suitable manners, in the exemplary embodiment of FIG. 9, a MEMS microphone package includes a laminate base layer 902, lid 904, resin layer 932, MEMS support layer 934, MEMS microphone structure 906, ASIC 910, and wirebonds 916 and 918.

MEMS microphone structure 906 is depicted in a simplified form, with internal components such as a diaphragm, back plate, acoustic signal paths, and front cavity not depicted in detail in FIG. 9. The MEMS support layer 934 of FIG. 9 includes an access port through which acoustic energy may be received within a front cavity of MEMS microphone structure 906, exciting the diaphragm of the MEMS microphone structure 906 with respect to a backplate of the MEMS microphone structure 906. Although the access port of the MEMS support layer 934 is depicted as a circular access port, the access port may be any suitable shape or configuration (e.g., including multiple access ports) based on a particular associated microphone structure 906 design and desirable acoustic properties. Signals from the MEMS microphone structure 906 may be provided to the ASIC 910 via wirebonds 916, and processed microphone signals may in turn be provided to external circuitry from ASIC 910 via wirebonds 918 and electrical connections of the laminate base layer 902. Lid 904 may attach to laminate base layer 902, forming a back cavity over MEMS microphone structure 906.

Figure 10:
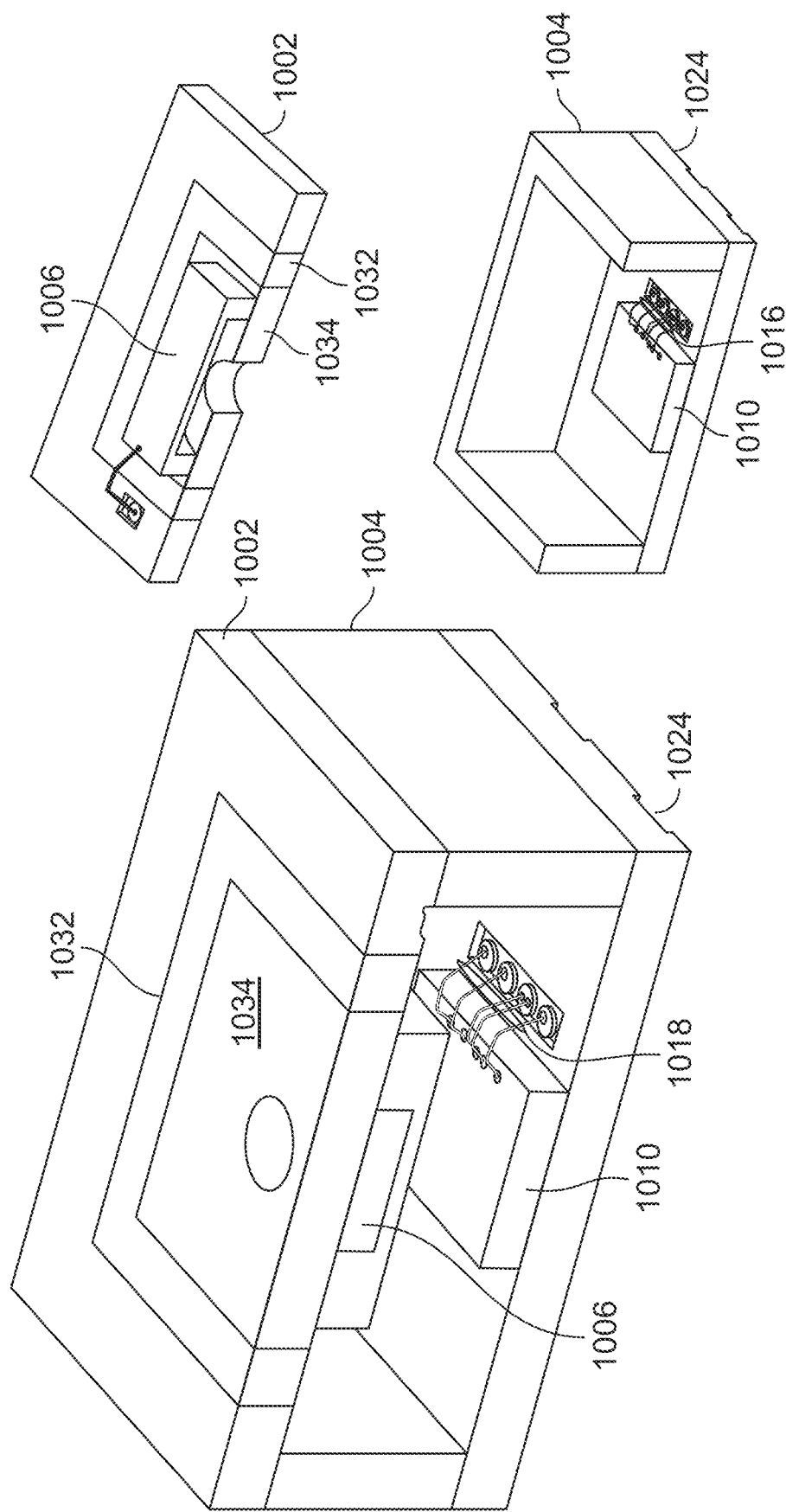
FIG. 10 shows an illustrative perspective view and section view of a stacked MEMS microphone package including a resin layer and MEMS support layer in accordance with an embodiment of the present disclosure.

FIG. 10 shows an illustrative perspective view and section view of a stacked MEMS microphone package including a resin layer and MEMS support layer in accordance with an embodiment of the present disclosure. Although it will be understood that components may be added, removed, or substituted from the microphone of FIG. 10 in a variety of suitable manners, in the exemplary embodiment of FIG. 10, a stacked MEMS microphone package includes a first laminate base layer 1002, sidewall 1004, second laminate base layer 1024, resin layer 1032, MEMS support layer 1034, MEMS microphone structure 1006, ASIC 1010, and wirebonds 1016 and 1018.

MEMS microphone structure 1006 is depicted in a simplified form, with internal components such as a diaphragm, back plate, acoustic signal paths, and front cavity not depicted in detail in FIG. 10. The MEMS support layer 1034 of FIG. 10 is located adjacent to first laminate base layer 1002 and coupled thereto by resin layer 1032. MEMS support layer 1034 includes an access port through which acoustic energy may be received within a front cavity of MEMS microphone structure 1006, exciting the diaphragm of the MEMS microphone structure 1006 with respect to a backplate of the MEMS microphone structure 1006. Although the access port of the MEMS support layer 1034 is depicted as a circular access port, the access port may be any suitable shape or configuration (e.g., including multiple access ports) based on a particular associated microphone structure 1006 design and desirable acoustic properties.

In the embodiment of FIG. 10, the ASIC 1010 is not located on the same (first) laminate base layer 1002 as the MEMS microphone, but is instead stacked on a second laminate base layer 1024 located opposite the first laminate base layer 1002. Although depicted as being located directly under MEMS structure 1006, an ASIC 1010 of a stacked microphone configuration may be located at other suitable locations relative to MEMS structure 1006, such as offset from MEMS structure 1006 or located on a sidewall 1004. Signals from the MEMS microphone structure 1006 may be provided to the ASIC 1010 via wirebonds 1016 directly, or as depicted in FIG. 10, indirectly via internal electrical connections of the laminate base layers and sidewall 1004. The processed microphone signals may in turn be provided to external circuitry from ASIC 1010 via wirebonds 1018 and electrical connections of the second laminate base layer 1002. Collectively the first laminate base layer 1002, second laminate base layer 1024, and sidewall 1004, forming a back cavity over MEMS microphone structure 1006.

Figure 11A:
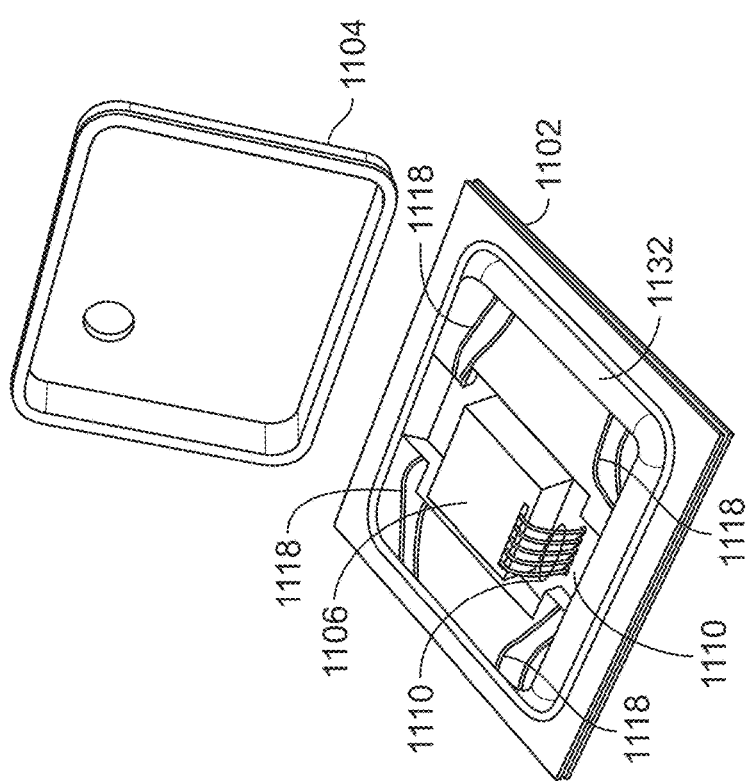
FIG. 11A shows an illustrative perspective view and section view of a MEMS pressure sensor package including a resin layer and MEMS support layer in accordance with an embodiment of the present disclosure.
Figure 11A:
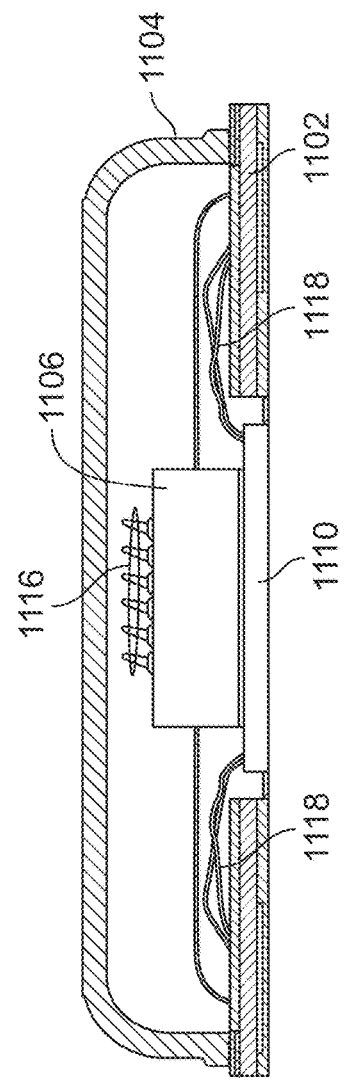

FIG. 11A shows an illustrative perspective view and section view of a MEMS pressure sensor package including a resin layer and MEMS support layer in accordance with an embodiment of the present disclosure. Although it will be understood that components may be added, removed, or substituted from the pressure sensor of FIG. 11 in a variety of suitable manners, in the exemplary embodiment of FIG. 11, a MEMS pressure package includes a laminate base layer 1102, lid 1004, resin layer 1132, ASIC/MEMS support layer 1110, MEMS pressure sensor structure 1106, and wirebonds 1116 and 1118.

MEMS pressure sensor structure 1106 is depicted in a simplified form, with internal components such as a diaphragm and fixed electrode not depicted in detail in FIG. 11. The ASIC and MEMS support layer 1110 of FIG. 11 are combined into a single component that both supplies structural support for the MEMS pressure sensor structure 1106 and also performs processing of output signals from MEMS pressure sensor structure 1106 (e.g., based on signals received via wirebonds 1116). The ASIC/MEMS support structure 1110 is located within a through hole of laminate base layer 1102 and coupled thereto by resin layer 1132. The processed pressure sensor signals may in turn be provided to external circuitry from ASIC/MEMS support structure 1110 via wirebonds 1118 and electrical connections of the laminate base layer 1102. In the embodiment of FIG. 11A, the wirebonds 1118 are encapsulated by resin layer 1132.

Figure 11B:
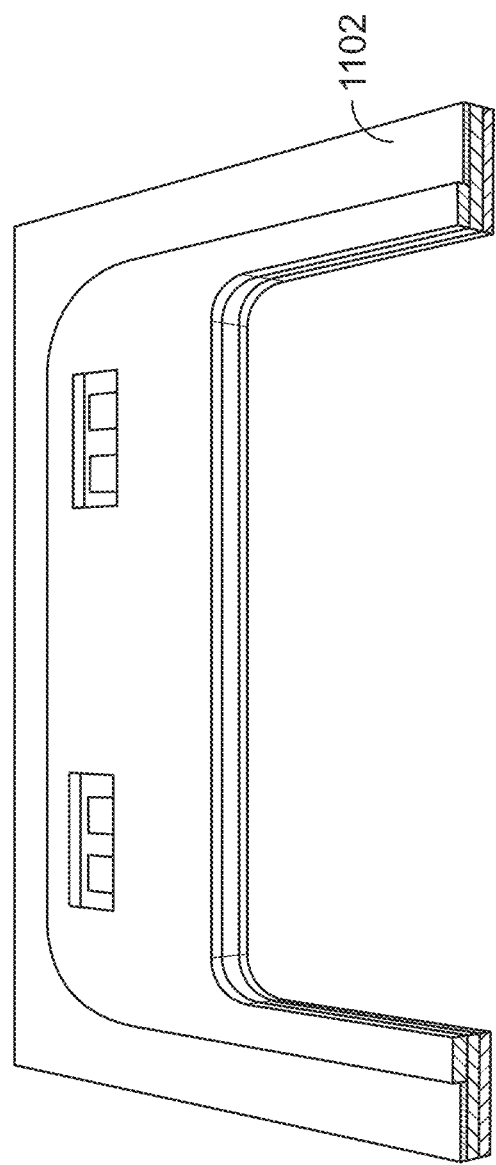
FIG. 11B shows an illustrative step of preparing the laminate of the MEMS pressure sensor of FIG. 11A in accordance with an embodiment of the present disclosure.
Figure 11B:
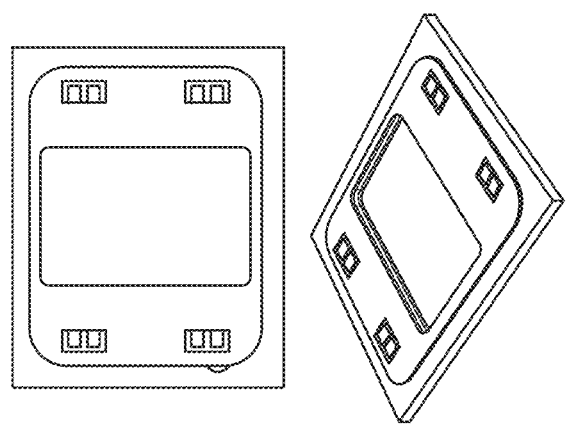

FIG. 11B shows an illustrative step of preparing the laminate of the MEMS pressure sensor of FIG. 11A in accordance with an embodiment of the present disclosure. As depicted in the section view of FIG. 11B, a laminate base layer 1102 includes a through hole to provide a suitable location for ASIC/MEMS support structure 1110 and resin layer 1132. The laminate base layer 1102 may also include electrical connections for connecting to the ASIC of the ASIC/MEMS support structure 1110, for communication with external circuitry and components. Processing may continue to the next step, as described in FIG. 11C.

FIG. 11C shows an illustrative step of taping the laminate of the MEMS pressure sensor of FIG. 11A in accordance with an embodiment of the present disclosure. In FIG. 11C, a fabrication base layer 1140 may be applied to the laminate base layer 1102, for example, such that the through hole of the laminate base layer 1102 is covered by the fabrication base layer, to facilitate placement of an ASIC/MEMS support structure 1110 and depositing of a resin layer 1132. Processing may continue to the next step, as described in FIG. 11D.

FIG. 11D shows an illustrative step of placing an application specific integrated circuit (ASIC) MEMS support layer for the MEMS pressure sensor of FIG. 11A in accordance with an embodiment of the present disclosure. In an embodiment, the MEMS support layer 1110 may include processing circuitry, such as an ASIC. The combine ASIC and MEMS support layer 1110 may perform both functions of providing physical support to the MEMS pressure sensor structure 1106 and the processing signals from the MEMS pressure sensor structure 1106. The ASIC/MEMS support structure 1110 may be placed on the fabrication base layer 1140, in a manner such that suitable spacing is provided between an outward-facing edge of the ASIC/MEMS support structure 1110 and the inward-facing edge of the laminate base layer 1102. Once the ASIC/MEMS support structure 1110 is placed on the fabrication base layer 1140, processing may continue to the next step, as described in FIG. 11E.

Figure 11E:
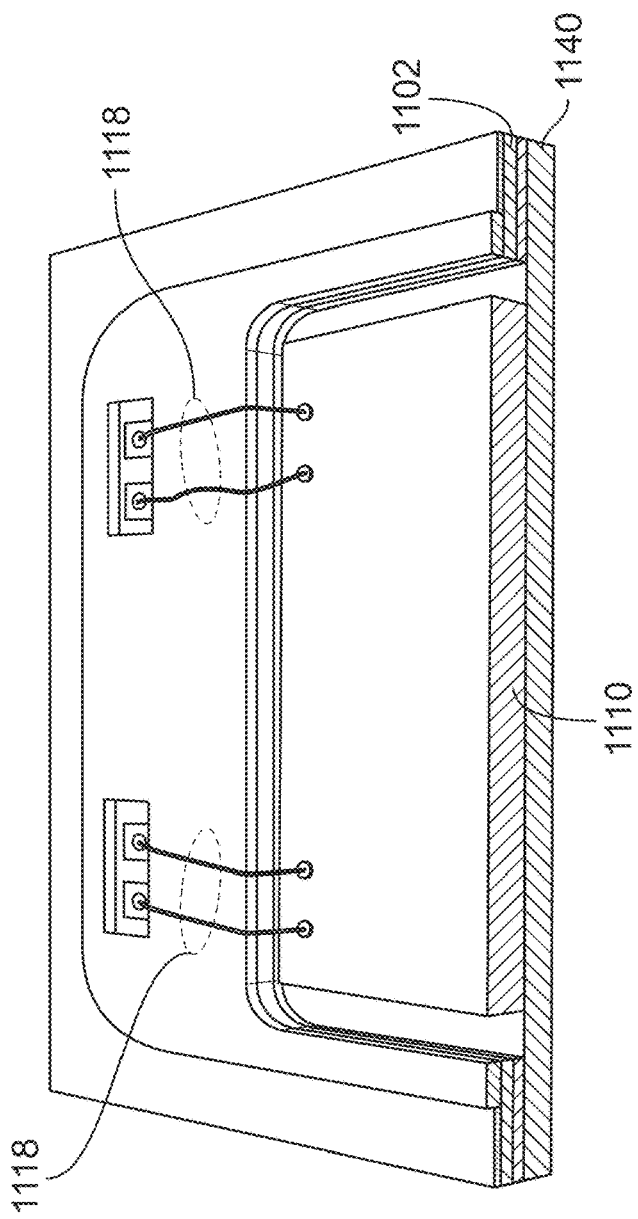
FIG. 11E shows an illustrative step of applying wire bonds to the ASIC support layer of the MEMS pressure sensor of FIG. 11A in accordance with an embodiment of the present disclosure.
Figure 11E:
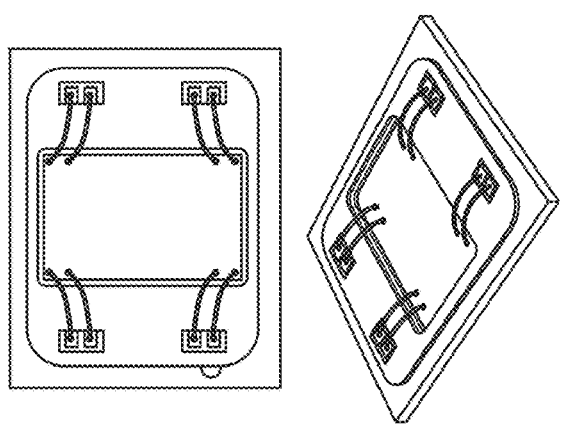

FIG. 11E shows an illustrative step of applying wire bonds to the ASIC support layer of the MEMS pressure sensor of FIG. 11A in accordance with an embodiment of the present disclosure. As described herein, wirebonds 1118 may provide for a communication path between the processing circuitry of ASIC/MEMS support structure 1110 and external circuitry, for example, via electrical connections of laminate base layer 1102. For example, processed pressure sensor outputs may be provided from the processing circuitry, and further, communications (e.g., modifying register values to change settings of the pressure sensor) may occur between the processing circuitry and external components. Once the wirebonds are applied to the ASIC/MEMS support structure 1110, processing may continue to the next step, as described in FIG. 11F.

Figure 11F:
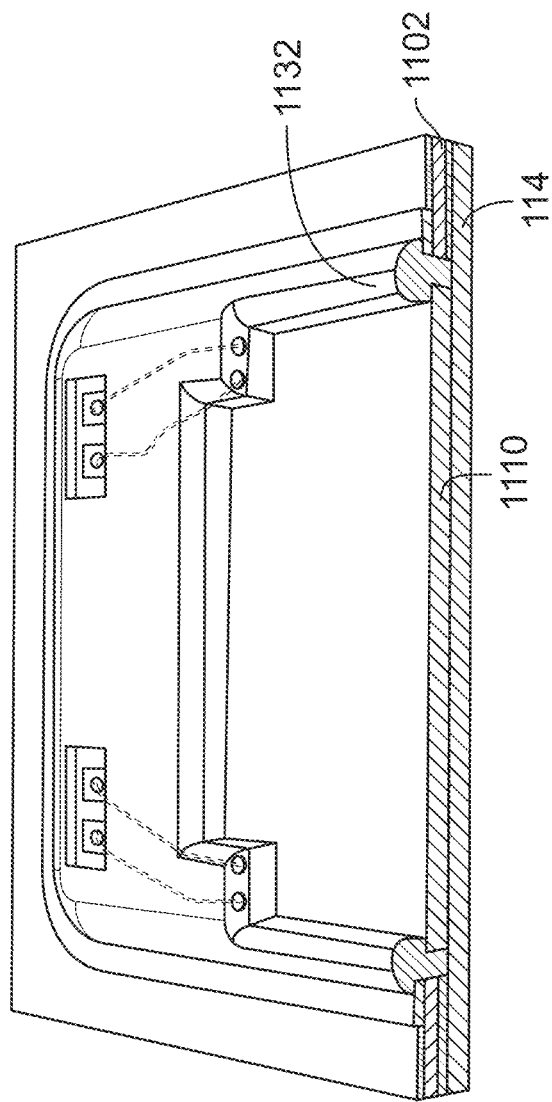
FIG. 11F shows an illustrative step of applying resin to adhere to the laminate and ASIC support layer of the MEMS pressure sensor of FIG. 11A in accordance with an embodiment of the present disclosure.
Figure 11F:
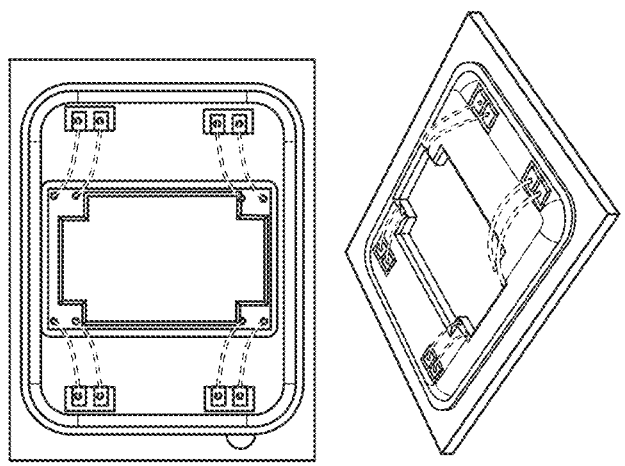

FIG. 11F shows an illustrative step of applying resin to adhere to the laminate and ASIC support layer of the MEMS pressure sensor of FIG. 11A in accordance with an embodiment of the present disclosure. As described herein, a resin layer 1132 may be deposited with respect to the through hole of the laminate base layer 1102. In the embodiment of FIG. 11F, a resin layer 1132 is deposited (e.g., via a suitable mold as described herein) to fill the remaining gaps between the ASIC/MEMS support structure 1110 and laminate base layer 1102 over the fabrication base layer 1102, and further, to encapsulate con cover other components of the pressure sensor, such as wirebonds 1118 and portions of ASIC/MEMS support structure 1110. Once the resin layer 1132 is applied to pressure sensor, processing may continue to the next step, as described in FIG. 11G.

Figure 11G:
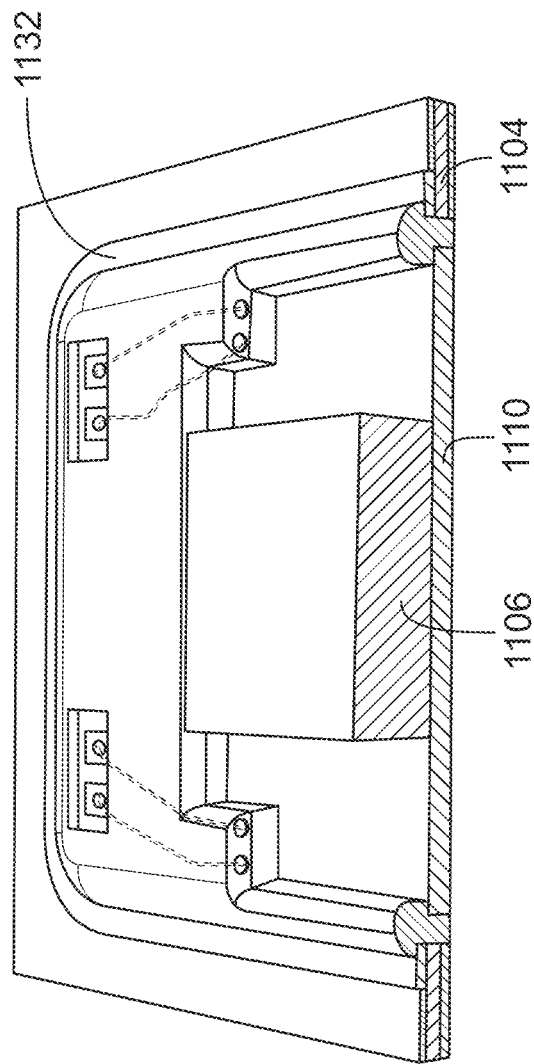
FIG. 11G shows an illustrative step of placing a MEMS structure on the ASIC support layer of the MEMS pressure sensor of FIG. 11A in accordance with an embodiment of the present disclosure.
Figure 11G:
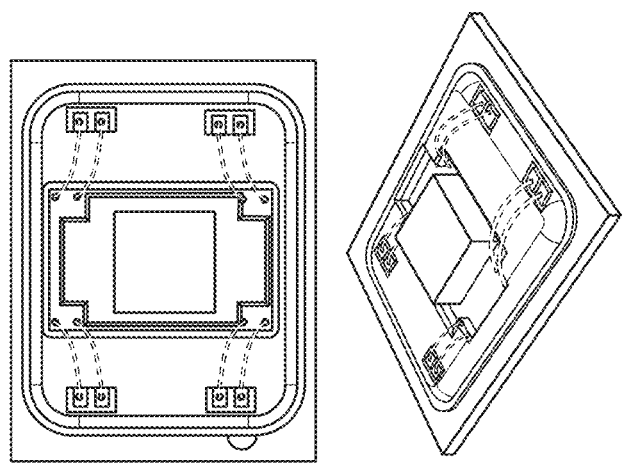

FIG. 11G shows an illustrative step of placing a MEMS structure on the ASIC support layer of the MEMS pressure sensor of FIG. 11A in accordance with an embodiment of the present disclosure. As described herein, a MEMS pressure sensor structure 1106 may include components (e.g., a diaphragm) that respond to changes of pressure within a volume, and in turn, move with respect to a fixed electrode. The corresponding signals are representative of a pressure within the volume. In the embodiment of FIG. 11A, the pressure sensor structure 1106 may be attached to the exposed upper surface of the ASIC/MEMS support structure 1110 (e.g., via a glue layer, not depicted in FIG. 11G). Once the MEMS sensor structure 1106 is attached to the ASIC/MEMS support structure 1110, processing may continue to the next step, as described in FIG. 11H.

FIG. 11H shows an illustrative step of providing wirebonds from the MEMS structure and placing a cap over the MEMS structure and ASIC MEMS support layer of the MEMS pressure sensor of FIG. 11A in accordance with an embodiment of the present disclosure. Once the MEMS pressure sensor structure 1106 is attached to the ASIC/MEMS support structure 1110, wirebonds 1116 may be provided from the MEMS pressure sensor structure 1106 to the ASIC/MEMS support structure 1110, in order to provide pressure-dependent signals for processing. Further, a lid 1104 may be attached to the laminate base layer. The lid 1104 may provide a pressure port 1150 to provide fluid communication between the internal volume of the pressure sensor and an external volume having a pressure to be measured. Based on the fluid communication between the external volume and the internal volume via pressure port 1150, the MEMS pressure sensor structure 1106 may output a signal representative of the pressure in the external volume to be measured.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical system (MEMS) sensor package, comprising:
    a laminate base layer comprising a through-hole opening perpendicular to an upper surface of the laminate base layer, wherein the through hole comprises one or more internal edge surfaces;
    a resin layer adhered to and covering the internal edge surfaces of the through hole;
    a MEMS support layer adhered to and surrounded by the resin layer within the through hole, wherein an upper surface of the MEMS support layer is parallel to the upper surface of the laminate base layer, and wherein the upper surface of the MEMS support layer is located within the opening of the laminate base layer below the upper surface of the laminate base layer; and a MEMS structure adhered to the upper surface of the MEMS support layer.

2. The MEMS sensor package of claim 1, further comprising a lid, wherein the lid is adhered to the upper surface of the laminate base layer, wherein the MEMS support layer is located within a volume defined by the lid.

3. The MEMS sensor package of claim 2, wherein the MEMS support layer comprises a through-hole, and wherein the through-hole is exposed to an internal volume of the MEMS structure and an external volume of the MEMS sensor package.

4. The MEMS sensor package of claim 1, wherein a MEMS sensor defined by the MEMS support layer comprises a microphone, an ultrasonic sensor, a pressure sensor, a micromirror, an accelerometer, or a gyroscope.

5. The MEMS sensor package of claim 4, wherein a MEMS sensor defined by the MEMS support layer comprises a microphone and the lid defines a back volume of the microphone.

6. The MEMS sensor package of claim 2, further comprising an application specific integrated circuit (ASIC) located on the upper surface of the laminate and within a volume defined by the lid.

7. The MEMS sensor package of claim 6, further comprising wire bonds from the MEMS structural layer to the ASIC.

8. The MEMS sensor package of claim 7, further comprising vias from the ASIC through the laminate base layer to an external surface of the laminate base layer.

9. The MEMS sensor package of claim 1, wherein the MEMS support layer comprises a material having a coefficient of thermal expansion less than 4*10-6 m/(m ° C.).

10. The MEMS sensor package of claim 1, wherein the MEMS support layer comprises an application specific integrated circuit (ASIC).

11. The MEMS sensor package of claim 1, wherein the MEMS support layer comprises a substrate layer of the MEMS structure.

12. The MEMS sensor package of claim 1, wherein the MEMS support layer comprises a ceramic material.

13. The MEMS sensor package of claim 1, wherein the MEMS structure comprises a MEMS pressure sensor, further comprising a lid adhered to the laminate base layer, wherein the lid defines a volume surrounding the MEMS support layer and comprises a through hole to an external volume of the lid.

14. The MEMS sensor package of claim 1, wherein the MEMS support layer comprises a CMOS layer of an inertial MEMS sensor.

15. The MEMS sensor package of claim 1, wherein the resin comprises a plastic or polymer that is applied by pin gate molding or cavity direct injection molding.

16. The MEMS sensor package of claim 1, wherein a plurality of the external edge surfaces of the MEMS support layer that intersect with the upper surface of the MEMS support layer intersects the upper surface of the MEMS support layer at an angle, and wherein the resin layer adheres to the MEMS support layer via the angled external edge surfaces.

17. The MEMS sensor package of claim 1, wherein a plurality of the internal edge surfaces of the laminate base layer intersect the upper surface of the laminate base layer at an angle, and wherein the resin layer adheres to the laminate base layer via the angled internal edge surfaces.

18. The MEMS sensor package of claim 1, wherein the upper surface of the MEMS support layer is located substantially parallel to the upper surface of the laminate base layer.

19. The MEMS sensor package of claim 1, wherein the laminate base layer comprises a plurality of electrical signal paths between an internal portion of the MEMS sensor package and an external surface of the MEMS sensor package.

20. The MEMS sensor package of claim 19, further comprising an ASIC within the internal portion of the MEMS package, wherein the plurality of electrical signal paths connect from the ASIC to the external surface of the MEMS package.

21. A device, comprising:
a laminate base layer comprising a through-hole opening perpendicular to an upper surface of the laminate base layer, wherein the through hole comprises one or more internal edge surfaces;
a resin layer adhered to and covering the internal edge surfaces of the through hole; and
a MEMS support layer adhered to and surrounded by the resin layer within the through hole, wherein an upper surface of the MEMS support layer is parallel to and recessed with respect to the upper surface of the laminate base layer.

22. A method, comprising:
providing a laminate base layer, wherein the laminate base layer comprises a through-hole opening perpendicular to an upper surface of the laminate base layer, wherein the through hole comprises one or more internal edge surfaces;
placing, within the through-hole of the laminate base layer, a MEMS support layer; and
depositing, in the through-hole between the MEMS support layer and the laminate base layer, a resin layer, wherein the resin layer is adhered to the MEMS support layer and the laminate base layer such that the MEMS support layer is coupled to the laminate base layer via the resin layer and such that an upper surface of the MEMS support layer is parallel to and recessed with respect to the upper surface of the laminate base layer.

23. The device of claim 21, further comprising:
a MEMS structure; and
a lid adhered to the upper surface of the laminate base layer, wherein the MEMS support layer is located within a volume defined by the lid, wherein the MEMS support layer comprises a through-hole, and wherein the through-hole is exposed to an internal volume of the MEMS structure and an external volume of the MEMS sensor package.

24. The device of claim 23, wherein a MEMS sensor defined by the MEMS support layer comprises a microphone and the lid defines a back volume of the microphone.

25. The device of claim 21, further comprising:
a MEMS structure; and
a lid adhered to the upper surface of the laminate base layer, wherein the MEMS structure comprises a MEMS pressure sensor, and wherein the lid defines a volume surrounding the MEMS support layer and comprises a through hole to an external volume of the lid.

26. The method of claim 22, further comprising adhering a MEMS structure to the upper surface of the MEMS support layer.

27. The method of claim 26, further comprising adhering a lid to the upper surface of the laminate base layer to define a volume surrounding the MEMS structure.

28. The method of claim 27, further comprising providing a hole through the MEMS support layer, wherein the MEMS structure comprises a MEMS microphone.

29. The method of claim 27, further comprising providing a hole through the lid, wherein the MEMS structure comprises a pressure sensor.

\* \* \* \* \*